(12) United States Patent
Soller

(10) Patent No.: US 9,147,600 B2
(45) Date of Patent: Sep. 29, 2015

(54) PACKAGES FOR MULTIPLE SEMICONDUCTOR CHIPS

(71) Applicant: Infineon Technologies AG, Neubiberg (DE)

(72) Inventor: Tyrone Jon Donato Soller, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 13/733,761

(22) Filed: Jan. 3, 2013

(65) Prior Publication Data

US 2014/0183711 A1     Jul. 3, 2014

(51) Int. Cl.
| | |
|---|---|
| *H01L 23/495* | (2006.01) |
| *H01L 23/34* | (2006.01) |
| *H01L 23/04* | (2006.01) |
| *H01L 23/02* | (2006.01) |
| *H01L 23/48* | (2006.01) |
| *H01L 23/52* | (2006.01) |
| *H01L 29/40* | (2006.01) |
| *H01L 21/768* | (2006.01) |
| *H01L 23/00* | (2006.01) |
| *H01L 23/13* | (2006.01) |
| *H01L 23/367* | (2006.01) |
| *H01L 23/498* | (2006.01) |
| *H01L 25/065* | (2006.01) |
| *H01L 21/56* | (2006.01) |
| *H01L 23/31* | (2006.01) |
| *H01L 25/16* | (2006.01) |

(52) U.S. Cl.
CPC .............. *H01L 21/768* (2013.01); *H01L 23/13* (2013.01); *H01L 23/3675* (2013.01); *H01L 23/49861* (2013.01); *H01L 24/97* (2013.01); *H01L 25/0652* (2013.01); *H01L 21/561* (2013.01); *H01L 23/3128* (2013.01); *H01L 23/3135* (2013.01); *H01L 25/16* (2013.01); *H01L 2224/48091* (2013.01); *H01L 2224/48227* (2013.01); *H01L 2224/48471* (2013.01); *H01L 2224/49171* (2013.01); *H01L 2224/49175* (2013.01); *H01L 2924/07802* (2013.01); *H01L 2924/1305* (2013.01); *H01L 2924/13034* (2013.01); *H01L 2924/13091* (2013.01); *H01L 2924/16195* (2013.01)

(58) Field of Classification Search
CPC ........... H01L 2224/48247; H01L 2924/01079; H01L 2924/01078; H01L 2924/14; H01L 25/0657; H01L 2924/15311; H01L 2224/16; H01L 2924/01029; H01L 2924/01013
USPC ......... 257/666, 723, 724, 730, 731, 685, 686, 257/777, 778, 782, 783, 786, 787
See application file for complete search history.

(56) References Cited

U.S. PATENT DOCUMENTS

| | | | | |
|---|---|---|---|---|
| 5,291,061 | A | * | 3/1994 | Ball ............................. 257/686 |
| 5,508,556 | A | * | 4/1996 | Lin .............................. 257/691 |
| 5,708,567 | A | | 1/1998 | Shim et al. |

(Continued)

*Primary Examiner* — A. Sefer
*Assistant Examiner* — Dilinh Nguyen
(74) *Attorney, Agent, or Firm* — Slater & Matsil, L.L.P.

(57) ABSTRACT

In accordance with an embodiment of the present invention, a semiconductor device has a substrate having a first surface and a second surface opposite the first surface. Also, the substrate has a first hole. A plurality of leads is disposed over the first surface of the substrate and a die paddle is disposed in the first hole. Additionally, an encapsulant is disposed on the die paddle and the plurality of leads.

15 Claims, 36 Drawing Sheets

(56) References Cited

U.S. PATENT DOCUMENTS 6,080,264 A * 6/2000 Ball .............................. 156/292
6,191,360 B1 2/2001 Tao et al.
6,246,115 B1 6/2001 Tang et al.
6,975,512 B1 12/2005 Ooi
8,018,037 B2 * 9/2011 Chen .............................. 257/676
2003/0214023 A1 * 11/2003 Uchida ......................... 257/686

* cited by examiner

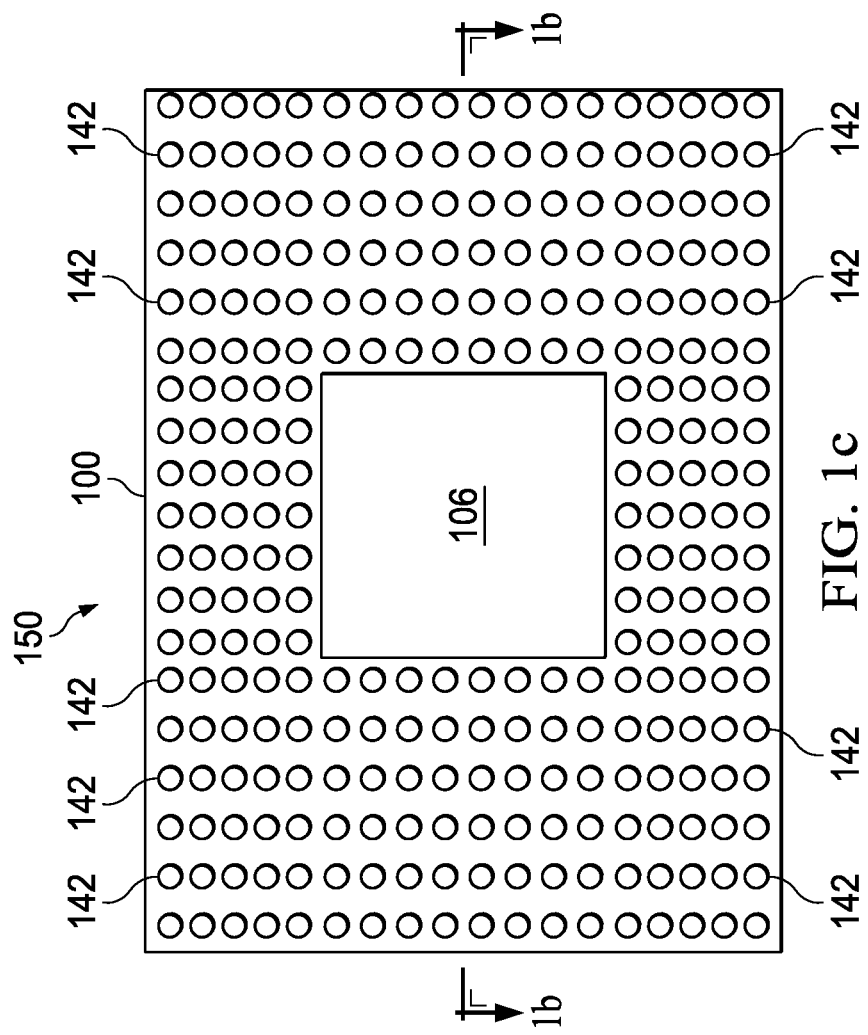

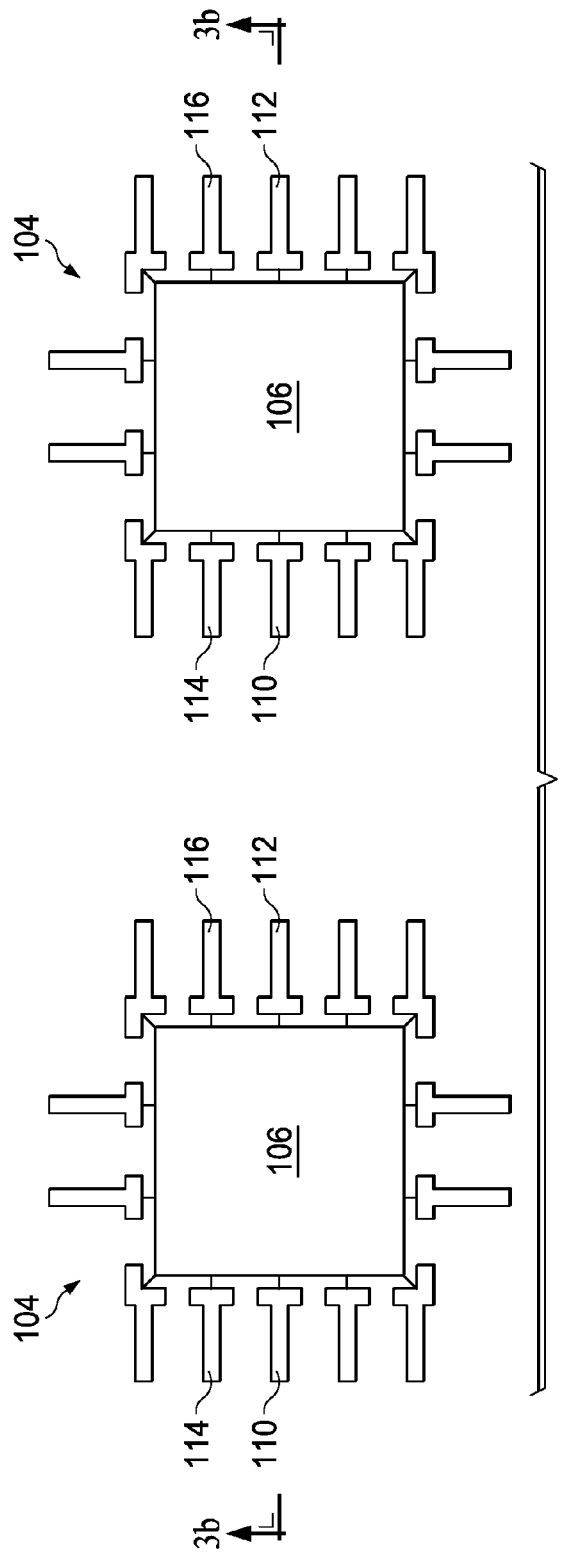
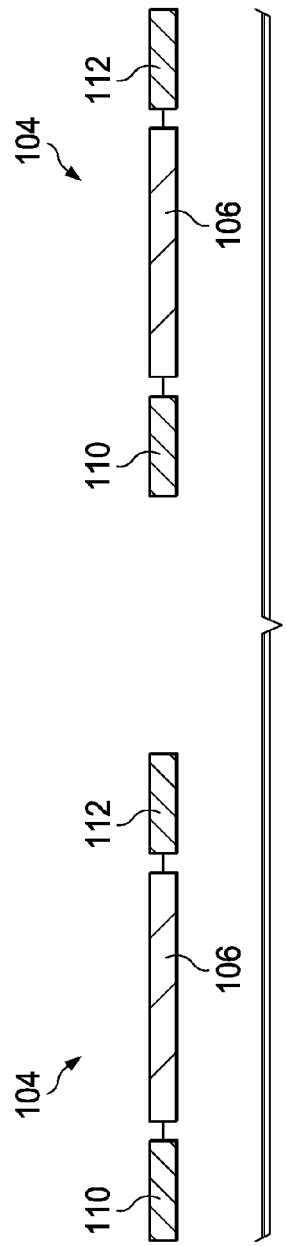
FIG. 3a
FIG. 3b

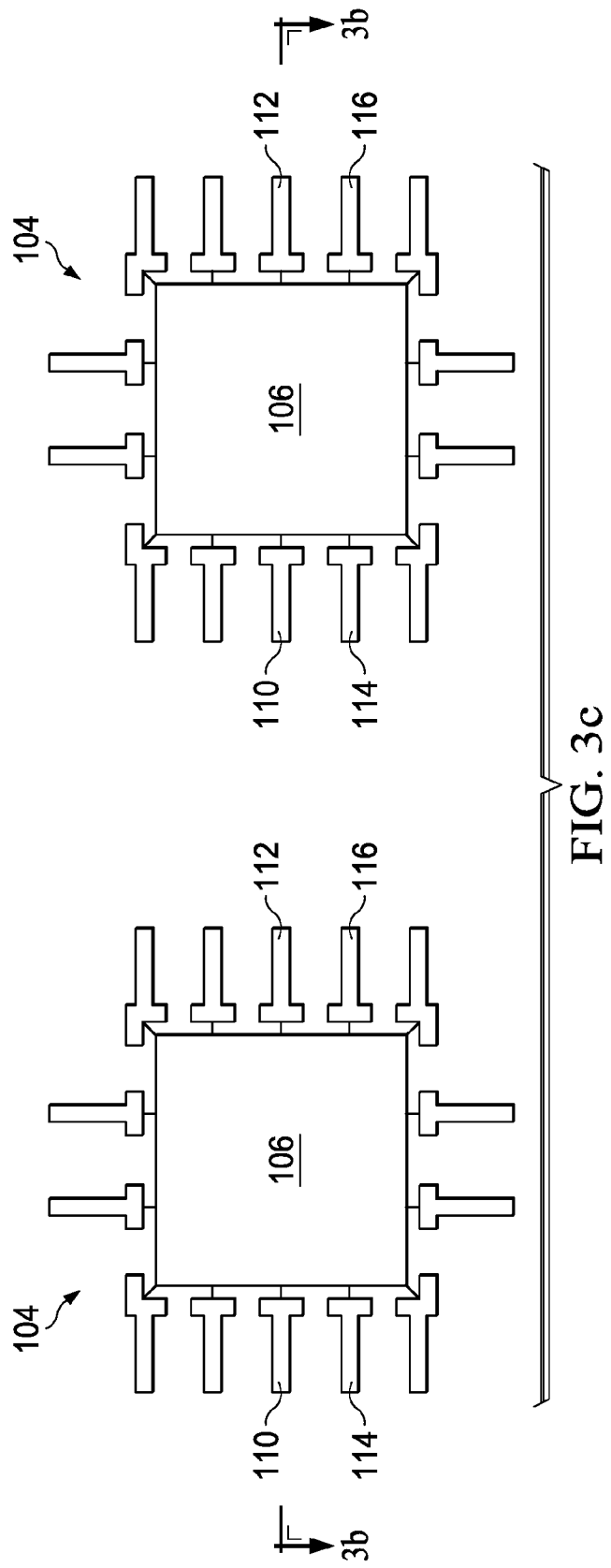

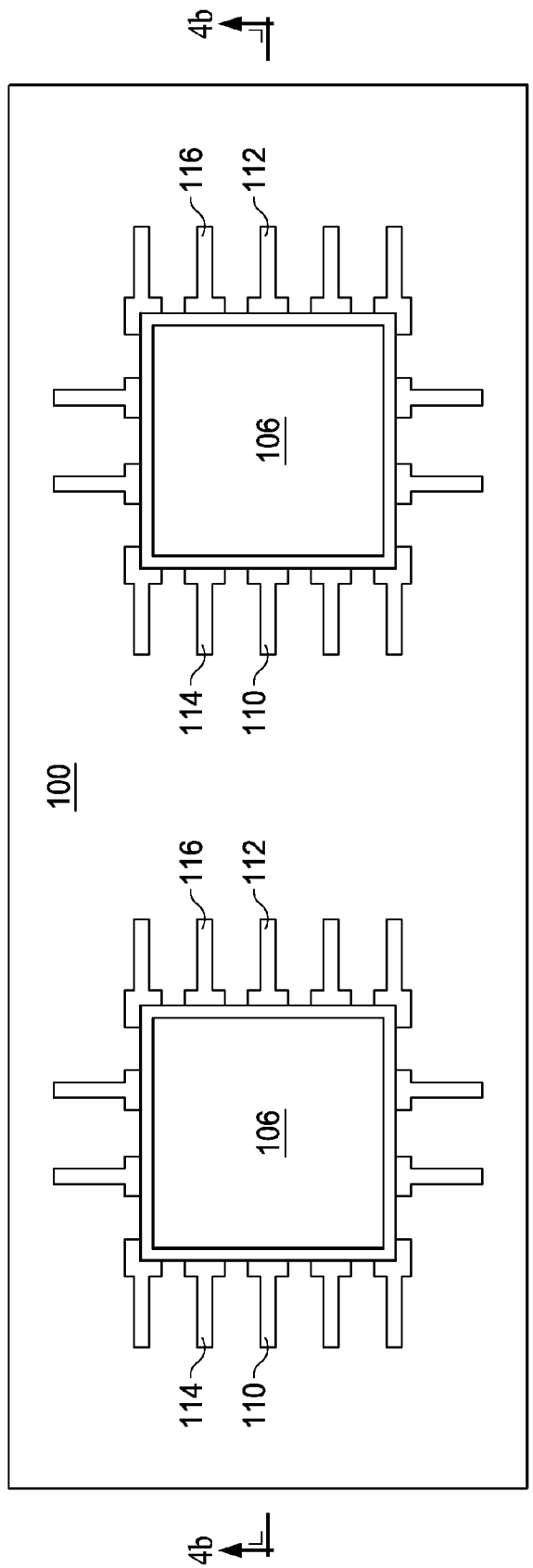
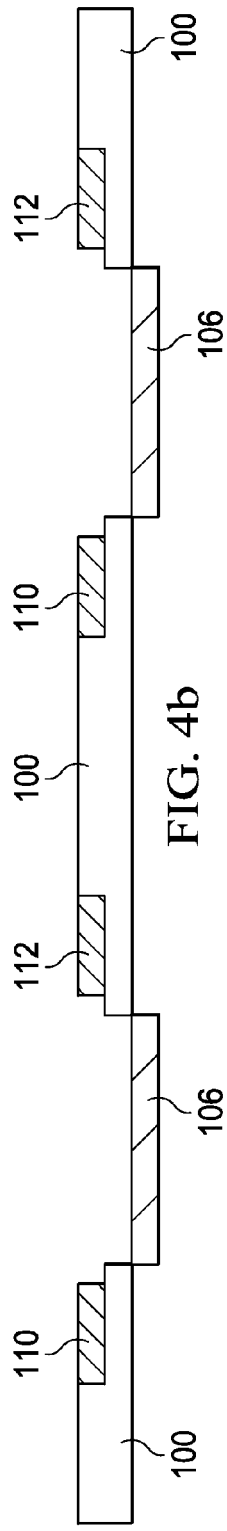
FIG. 4a
FIG. 4b

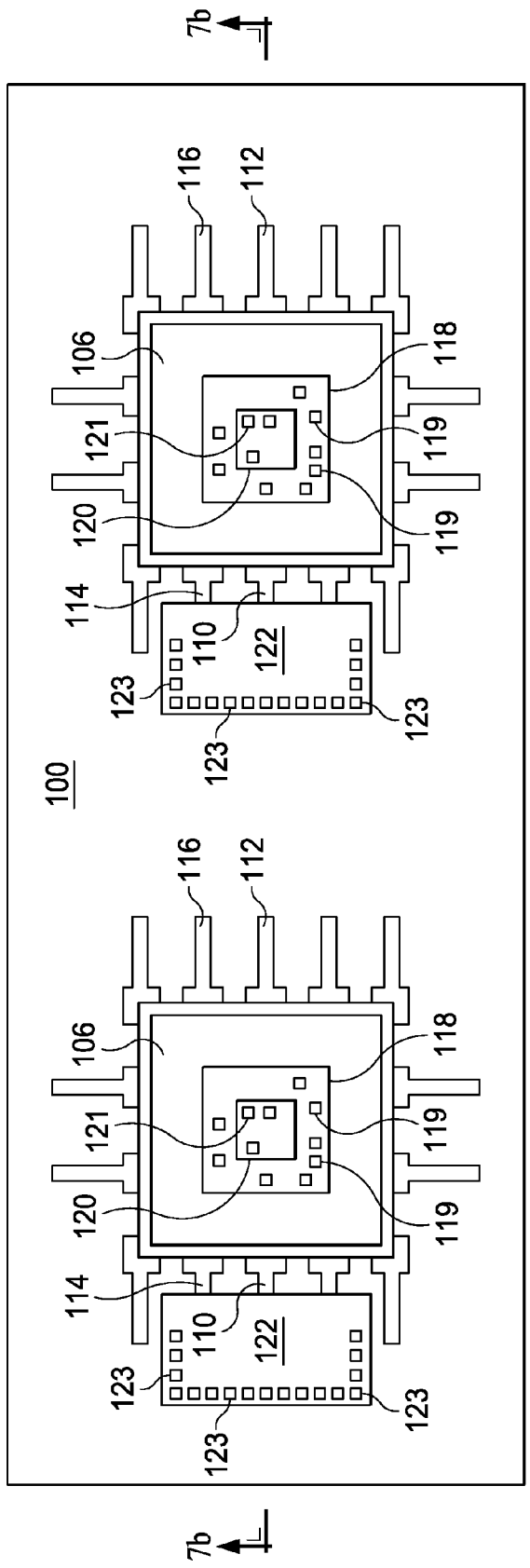
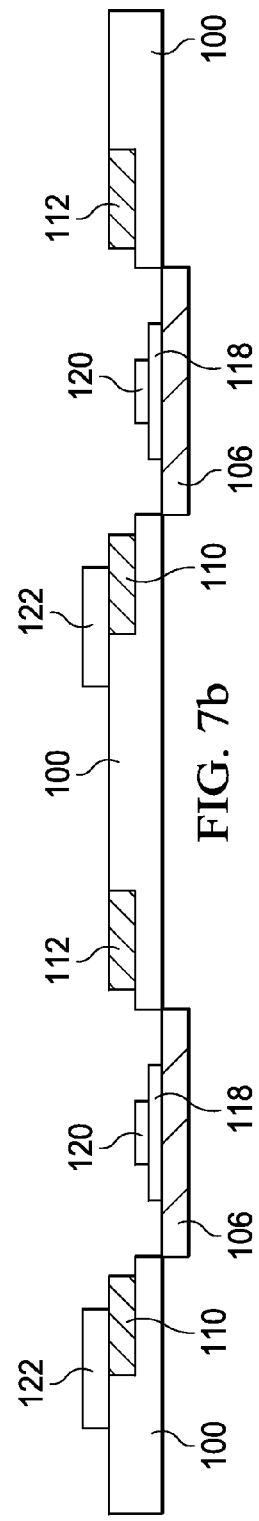
FIG. 7a
FIG. 7b

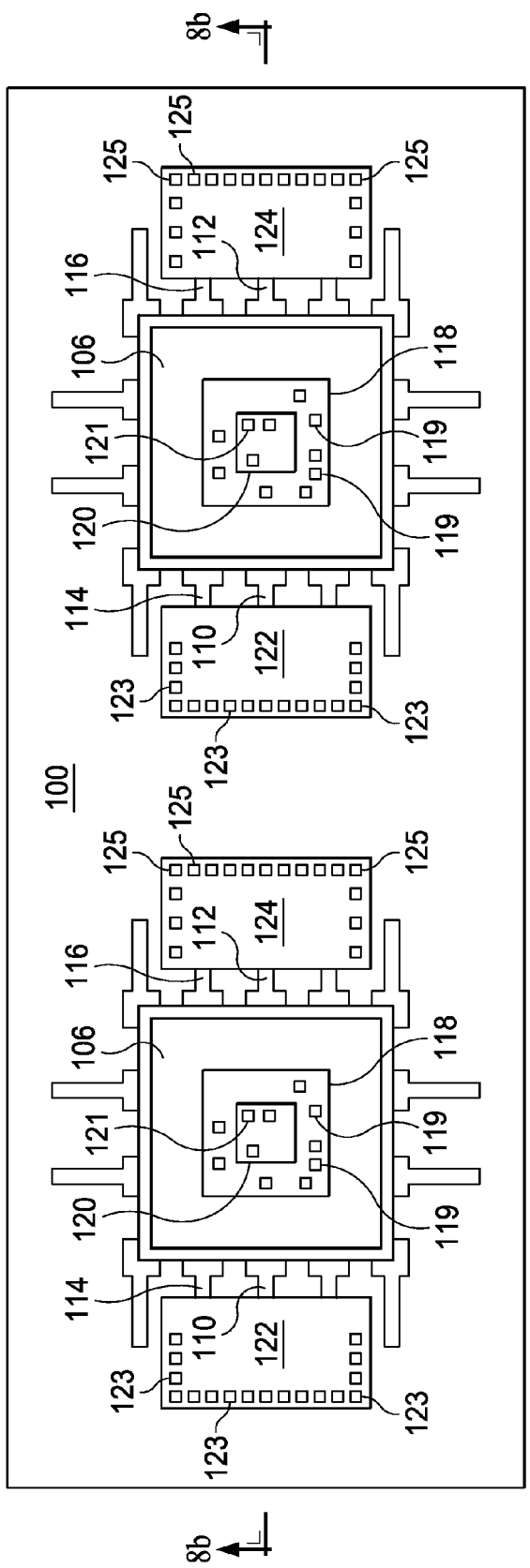
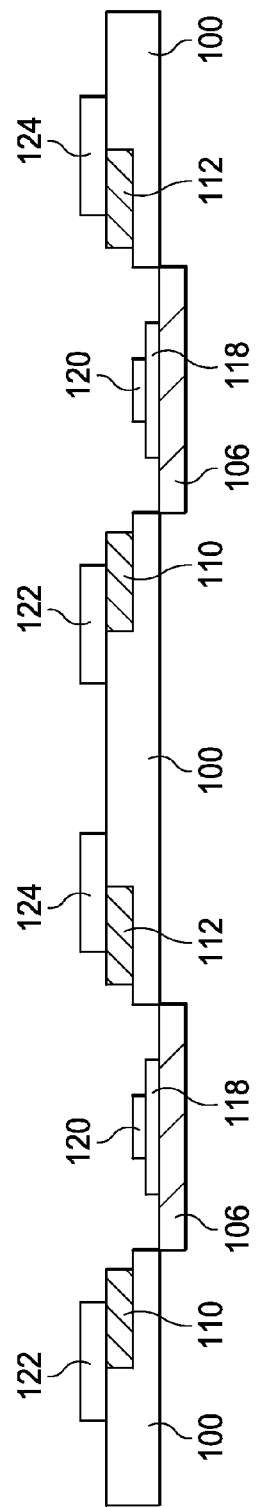
FIG. 8a
FIG. 8b

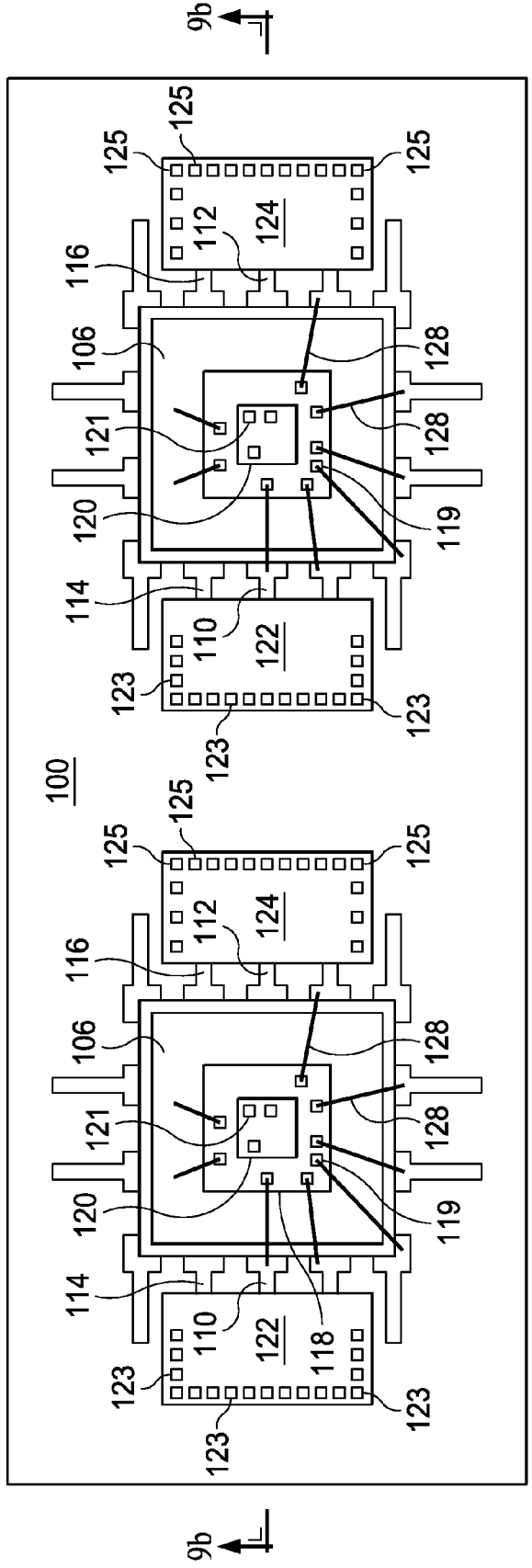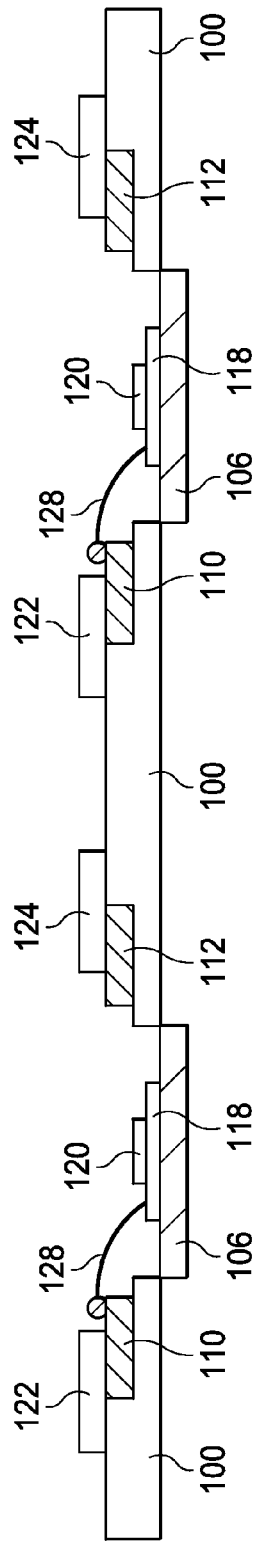
FIG. 9a
FIG. 9b

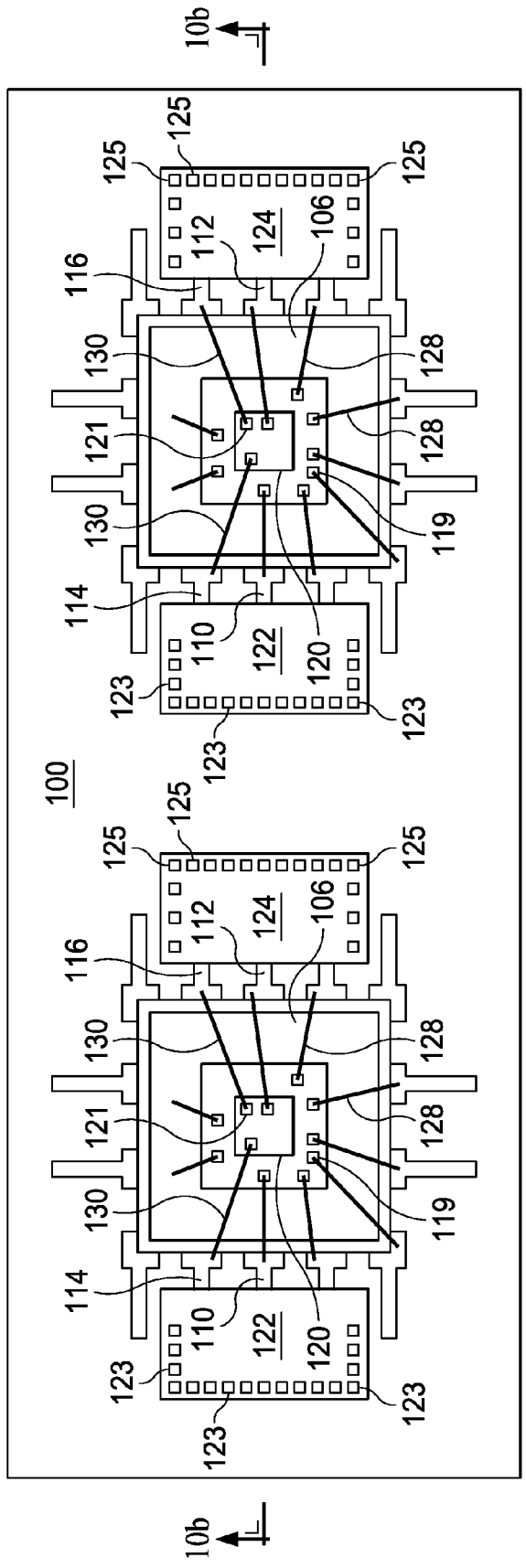
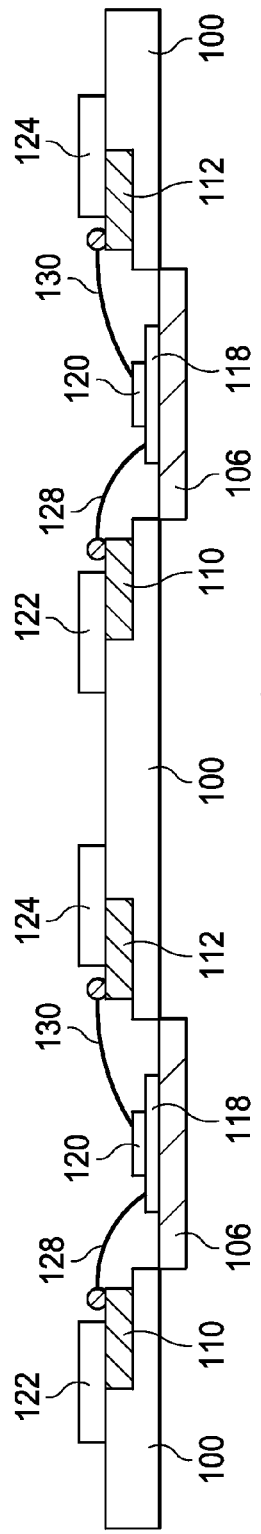
FIG. 10a
FIG. 10b

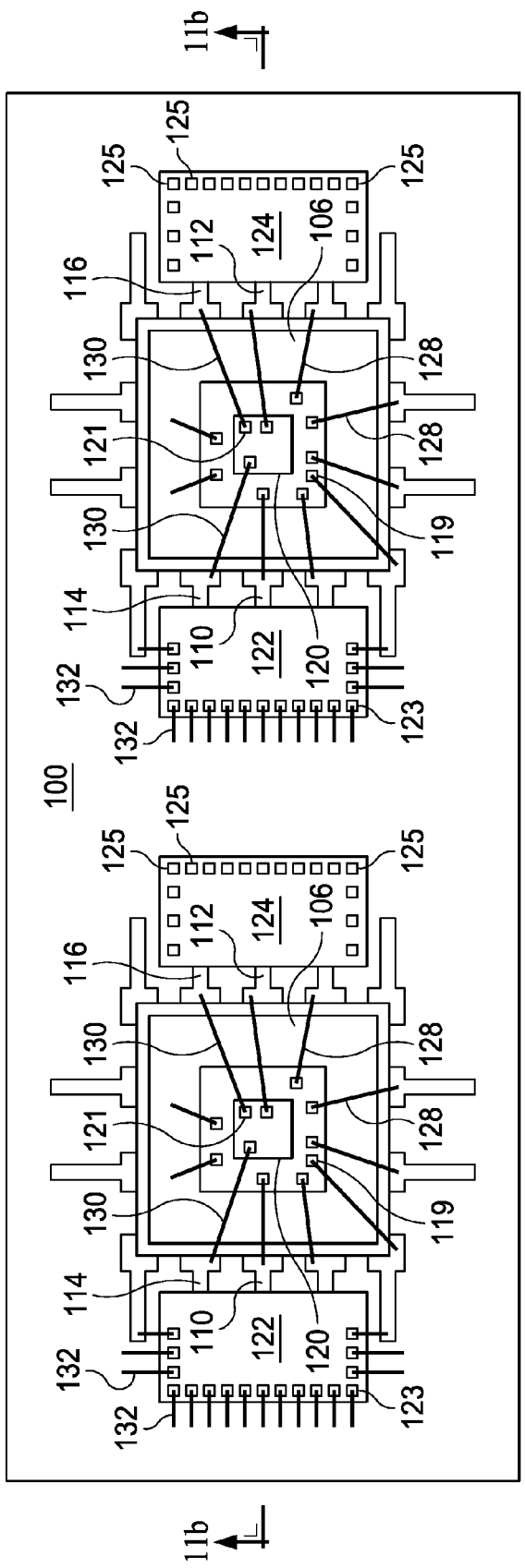
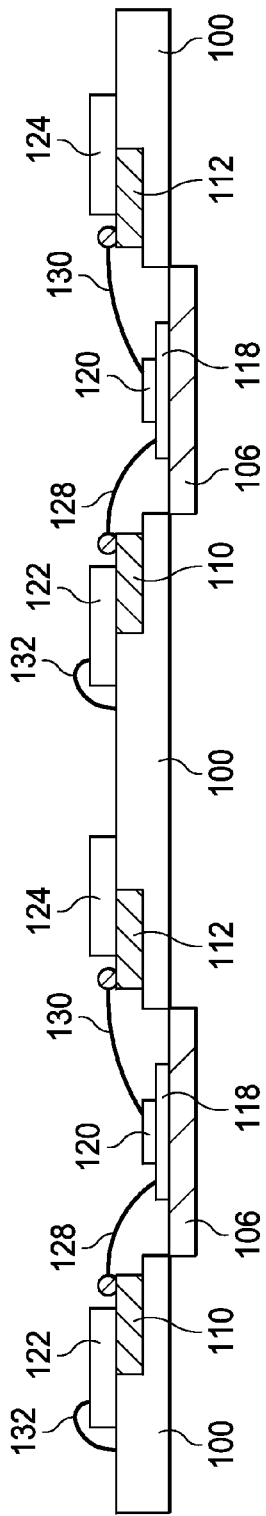
FIG. 11a
FIG. 11b

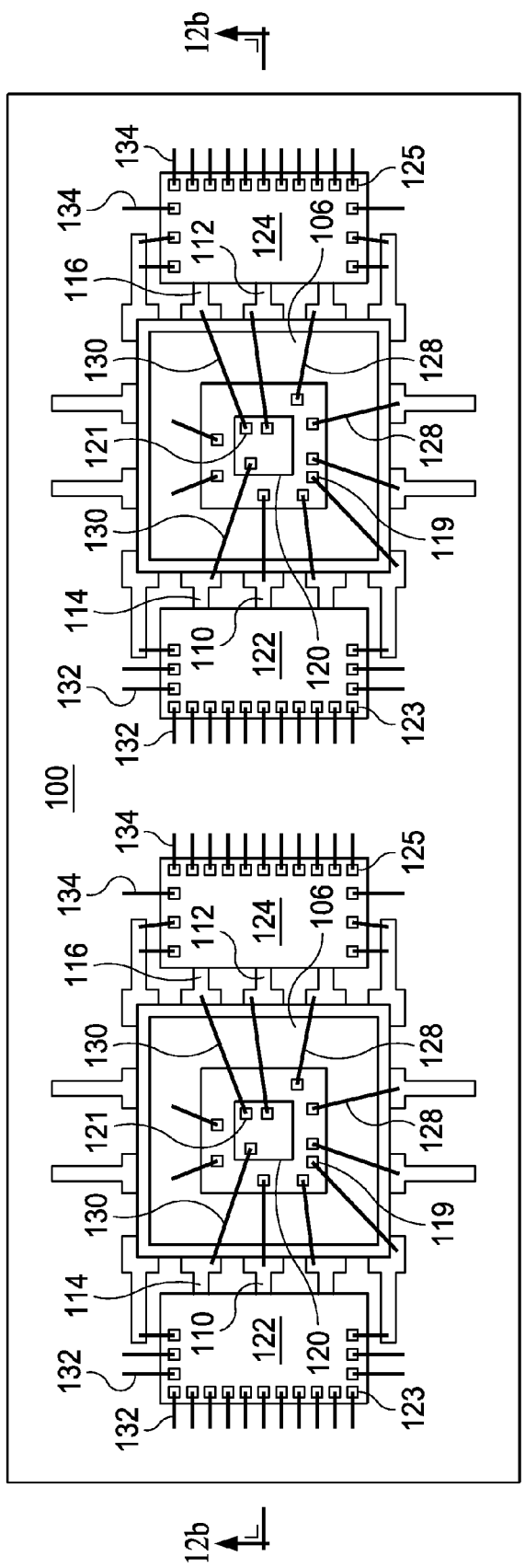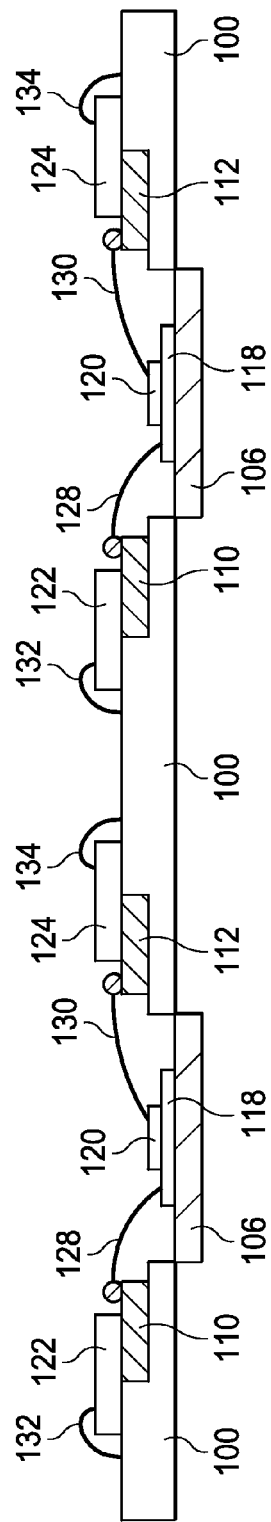
FIG. 12a
FIG. 12b

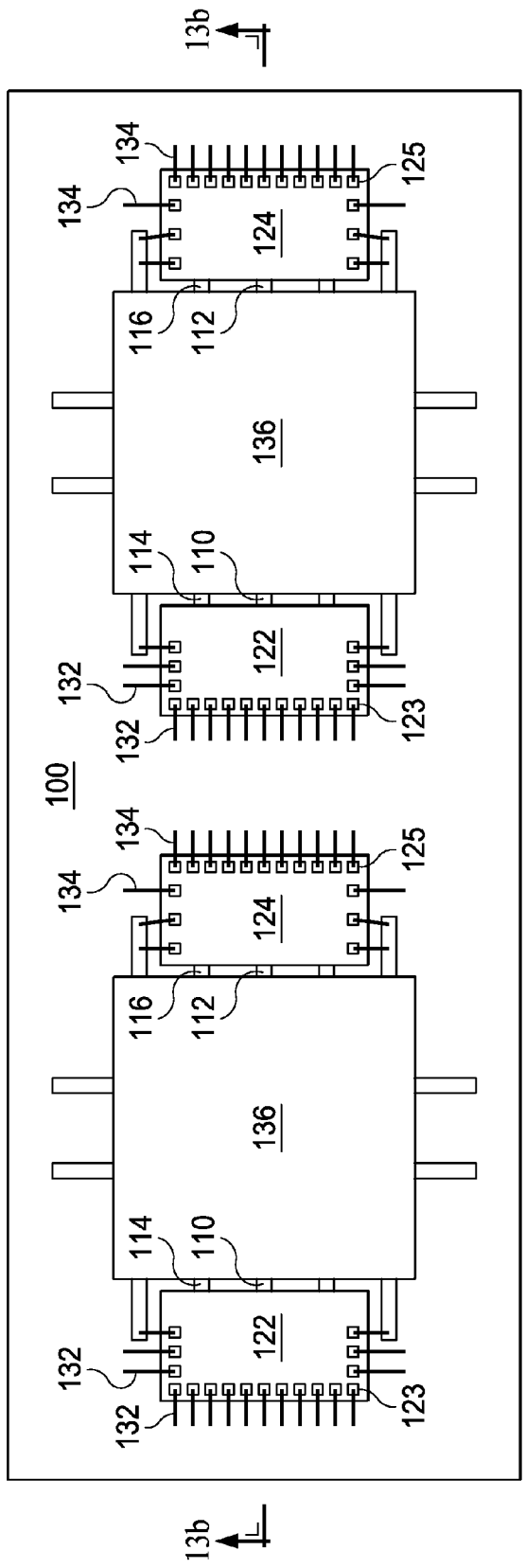
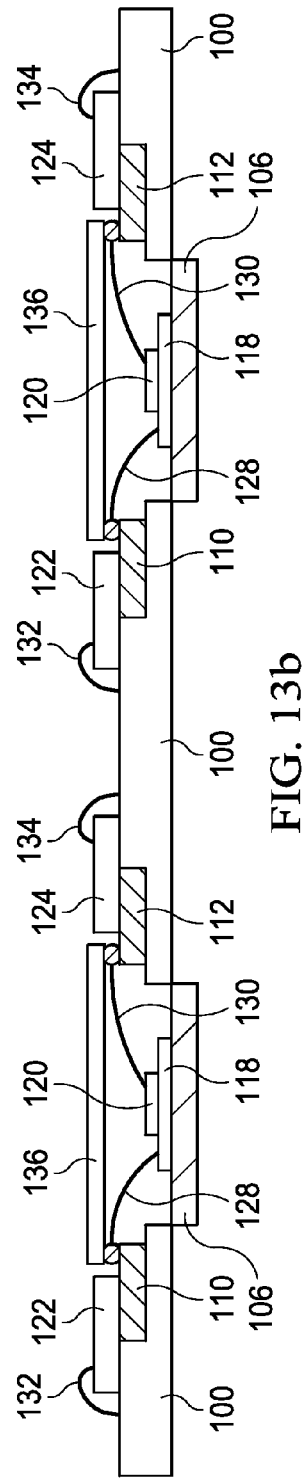
FIG. 13a
FIG. 13b

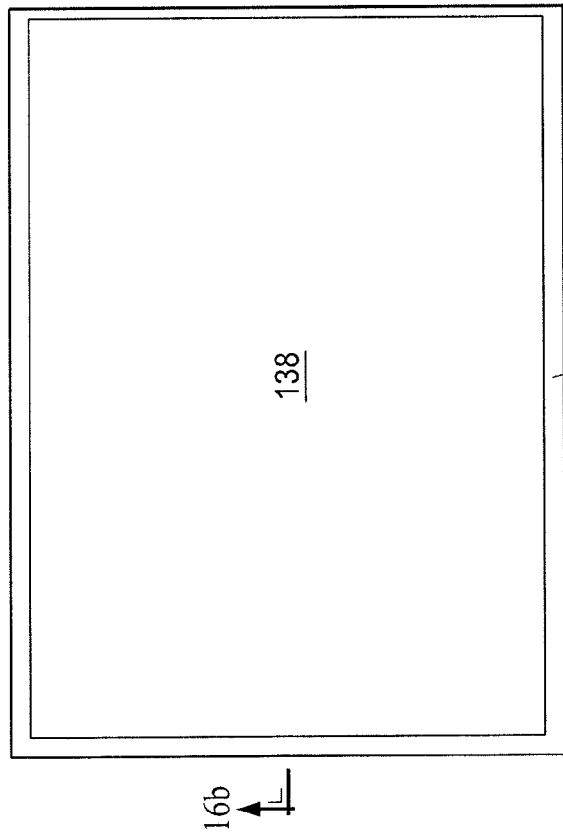
FIG. 16a
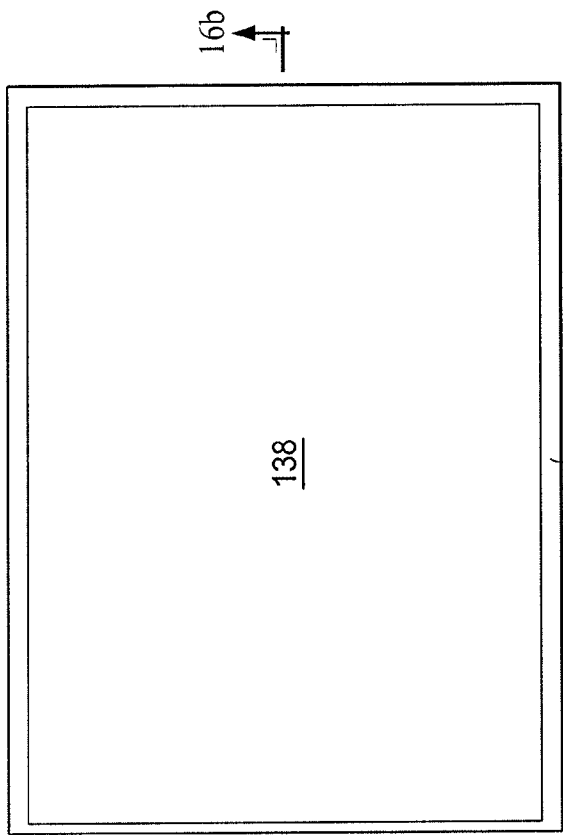
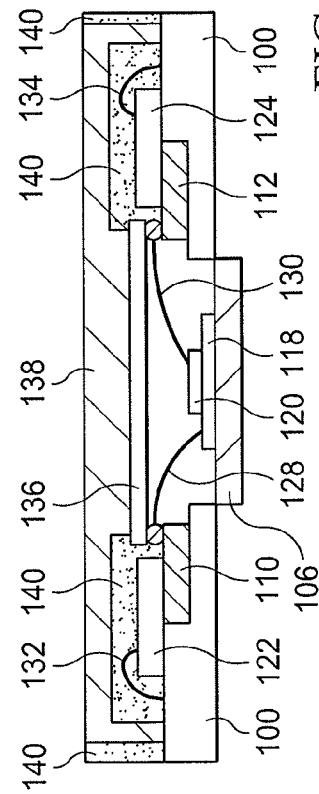
FIG. 16b
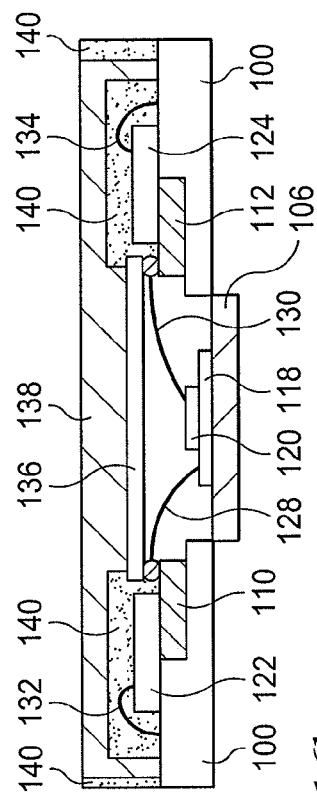

A BALL GRID ARRAY CERAMIC SUBSTRATE COMPRISING ELECTRICAL CIRCUITRY TO COUPLE CONTACTS ON A FIRST SURFACE TO CONTACTS ON A SECOND SURFACE

A PLURALITY OF LEADS IS DISPOSED OVER THE FIRST SURFACE OF THE BALL GRID ARRAY CERAMIC SUBSTRATE, ONE OR MORE LEADS OF THE PLURALITY OF LEADS COUPLED TO THE CONTACTS ON THE FIRST SURFACE

A DIE PADDLE IS DISPOSED IN A FIRST HOLE IN THE BALL GRID ARRAY CERAMIC SUBSTRATE

A FIRST CHIP DISPOSED OVER THE DIE PADDLE

A SECOND CHIP DISPOSED OVER THE FIRST CHIP

A THIRD CHIP DISPOSED OVER THE FIRST SURFACE OF THE BALL GRID ARRAY CERAMIC SUBSTRATE

A FOURTH CHIP DISPOSED OVER THE FIRST SURFACE OF THE BALL GRID ARRAY CERAMIC SUBSTRATE

A FIFTH CHIP DISPOSED OVER THE FIRST SURFACE OF THE BALL GRID ARRAY CERAMIC SUBSTRATE

AN ENCAPSULANT DISPOSED OVER THE BALL GRID ARRAY CERAMIC SUBSTRATE, DIE PADDLE AND THE PLURALITY OF LEADS

*Figure 19*

PACKAGES FOR MULTIPLE SEMICONDUCTOR CHIPS

TECHNICAL FIELD

The present invention relates generally to semiconductor packages, and more particularly to multi-chip semiconductor packages and assembly thereof.

BACKGROUND

Electronic component packaging is generally the final stage of semiconductor device fabrication. The package may enable electrical interconnection between the semiconductor chip and another electrical component, such as a printed circuit board (PCB) or a motherboard. Also, the package may physically protect the chip from breakage or contamination. Additionally, the package may protect the chip from chemicals, moisture and/or gases that may interfere with the chip. Further, the package may dissipate heat from the chip when the chip is under operation.

Surface mounted technology is a technology for mounting electronic devices directly onto the surface of a PCB. Surface mounted devices may have short pins or leads of various styles, flat contacts, matrixes of solder balls such as a Ball Grid Array (BGA), or terminations on the body.

One type of surface mounted device involves a semiconductor device which is mounted on a metallic support or lead frame. The semiconductor device contacts are electrically connected to the lead frame using bond wires. The backside of the semiconductor device may also be connected to the lead frame. After connecting the semiconductor device to the lead frame, the system is encapsulated with a molding compound. Lead frame packages are used in packaging semiconductor chips because of their low manufacturing cost and high reliability.

SUMMARY OF THE INVENTION

In accordance with an embodiment of the present invention, a semiconductor device has a substrate having a first surface and a second surface opposite the first surface. Also, the substrate has a first hole. A plurality of leads is disposed over the first surface of the substrate and a die paddle is disposed in the first hole. Additionally, an encapsulant is disposed on the die paddle and the plurality of leads.

In accordance with another embodiment of the present invention, a semiconductor device has a first chip support having a first surface and a second surface opposite the first surface. Also, the first chip support has a first hole. The semiconductor device also has a second chip support attached to the first chip support and disposed in the first hole of the first chip support. Additionally, the semiconductor device has a plurality of leads disposed on the first surface of the first chip support. Further, the semiconductor device has a third chip support attached to the first surface of the first chip support.

In accordance with yet another embodiment of the present invention, a method of fabricating a semiconductor device includes providing a substrate with an attached lead frame, where the substrate has a first surface, a second surface opposite the first surface, and a hole. Also, the lead frame has a die paddle disposed in the hole of the substrate and a plurality of leads attached to the first surface of the substrate. Additionally, the method includes attaching a first chip to the first surface of the substrate and to a first lead of the plurality of leads. Further, the method includes encapsulating the lead frame and the first chip.

BRIEF DESCRIPTION OF THE DRAWINGS

For a more complete understanding of the present invention, and the advantages thereof, reference is now made to the following descriptions taken in conjunction with the accompanying drawing, in which:

FIGS. 1a, 1b, and 1c illustrate a semiconductor package in accordance with an embodiment of the invention, wherein FIG. 1a illustrates a top view, FIG. 1b illustrates a cross-sectional view, and FIG. 1c illustrates a back view;

FIGS. 2a, 2b, 2c, and 2d illustrate a substrate used in accordance with embodiments of the invention, wherein FIG. 2a illustrates a top view, FIGS. 2b and 2d illustrates a cross-sectional view, and FIG. 2c illustrates a back view;

FIGS. 3a, 3b, and 3c illustrate a lead frame used in accordance with embodiments of the invention, wherein FIG. 3a illustrates a top view, FIG. 3b illustrates a cross-sectional view, and FIG. 3c illustrates a back view;

FIGS. 4a, 4b, and 4c illustrate a lead frame attached to a substrate in accordance with an embodiment of the invention, wherein FIG. 4a illustrates a top view, FIG. 4b illustrates a cross-sectional view, and FIG. 4c illustrates a back view;

FIGS. 5a, 5b, and 5c illustrate a semiconductor package during fabrication after a first chip is attached to a die paddle in accordance with an embodiment of the invention, wherein FIG. 5a illustrates a top view, FIG. 5b illustrates a cross-sectional view, and FIG. 5c illustrates a back view;

FIGS. 6a, 6b, and 6c illustrate a semiconductor package during fabrication after a second chip is attached to a first chip in accordance with an embodiment of the invention, wherein FIG. 6a illustrates a top view, FIG. 6b illustrates a cross-sectional view, and FIG. 6c illustrates a back view;

FIGS. 7a, 7b, and 7c illustrate a semiconductor package during fabrication after a third chip is attached to a substrate and a plurality of leads in accordance with an embodiment of the invention, wherein FIG. 7a illustrates a top view, FIG. 7b illustrates a cross-sectional view, and FIG. 7c illustrates a back view;

FIGS. 8a, 8b, and 8c illustrate a semiconductor package during fabrication after a fourth chip is attached to a substrate and a plurality of leads in accordance with an embodiment of the invention, wherein FIG. 8a illustrates a top view, FIG. 8b illustrates a cross-sectional view, and FIG. 8c illustrates a back view;

FIGS. 9a, 9b, and 9c illustrate a semiconductor package during fabrication after bond wires are attached connected between a first chip and a plurality of leads in accordance with an embodiment of the invention, wherein FIG. 9a illustrates a top view, FIG. 9b illustrates a cross-sectional view, and FIG. 9c illustrates a back view;

FIGS. 10a, 10b, and 10c illustrate a semiconductor package during fabrication after bond wires are attached connected between a second chip and a plurality of leads in accordance with an embodiment of the invention, wherein FIG. 10a illustrates a top view, FIG. 10b illustrates a cross-sectional view, and FIG. 10c illustrates a back view;

FIGS. 11a, 11b, and 11c illustrate a semiconductor package during fabrication after bond wires are attached connected between a third chip and a plurality of leads in accordance with an embodiment of the invention, wherein FIG. 11a illustrates a top view, FIG. 11b illustrates a cross-sectional view, and FIG. 11c illustrates a back view;

FIGS. 12a, 12b, and 12c illustrate a semiconductor package during fabrication after bond wires are attached connected between a fourth chip and a plurality of leads in accordance with an embodiment of the invention, wherein FIG. 12a illustrates a top view, FIG. 12b illustrates a cross-sectional view, and FIG. 12c illustrates a back view;

FIGS. 13a, 13b, and 13c illustrate a semiconductor package during fabrication after a fifth chip is attached to a substrate and a plurality of leads in accordance with an embodiment of the invention, wherein FIG. 13a illustrates a top view, FIG. 13b illustrates a cross-sectional view, and FIG. 13c illustrates a back view;

FIGS. 14a, 14b, and 14c illustrate a semiconductor package during fabrication after a heat sink is attached to a substrate and a fifth chip in accordance with an embodiment of the invention, wherein FIG. 14a illustrates a top view, FIG. 14b illustrates a cross-sectional view, and FIG. 14c illustrates a back view;

FIGS. 15a, 15b, and 15c illustrate a semiconductor package during fabrication after molding compound is formed between a fifth chip and a die paddle and between a heat sink and a substrate in accordance with an embodiment of the invention, wherein FIG. 15a illustrates a top view, FIG. 15b illustrates a cross-sectional view, and FIG. 15c illustrates a back view;

FIGS. 16a, 16b, and 16c illustrate singulated semiconductor packages in accordance with an embodiment of the invention, wherein FIG. 16a illustrates a top view, FIG. 16b illustrates a cross-sectional view, and FIG. 16c illustrates a back view;

FIGS. 17a, 17b, and 17c illustrate singulated semiconductor packages after a plurality of solder balls is attached to a substrate in accordance with an embodiment of the invention, wherein FIG. 17a illustrates a top view, FIG. 17b illustrates a cross-sectional view, and FIG. 17c illustrates a back view;

FIG. 19 illustrates a block view of the ball grid array in accordance with various embodiments of the present invention.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The present invention will be described with respect to embodiments in a specific context, namely a method of manufacturing semiconductor devices. The specific embodiments discussed are merely illustrative of specific ways to make and use the invention, and do not limit the scope of the invention.

Integrating multiple chips into a single semiconductor package requires the use of large die pads for supporting all of the chips. Alternatively, multiple die pads are used such that each die pad supports a particular chip. However, all these integration methods increase the package size, thereby requiring the use of expensive packaging techniques. For example, larger packages require the use of a more expensive cavity molding process; whereas smaller packages can be fabricated using the less expensive mold array process (MAP) also called map molding process. In various embodiments, the present invention reduces the package size of multi-chip semiconductor packages by using a novel integration scheme. This allows the use of the less expensive map molding process. In various embodiments, the present invention reduces the package size by partially stacking chips, thereby reducing the package size.

A structural embodiment of a semiconductor package will be described using FIG. 1, while a method of fabricating the semiconductor package in accordance with embodiments of the invention will be described using FIGS. 2-17. Alternative structural embodiments will be described using FIG. 18.

Figure 1A:
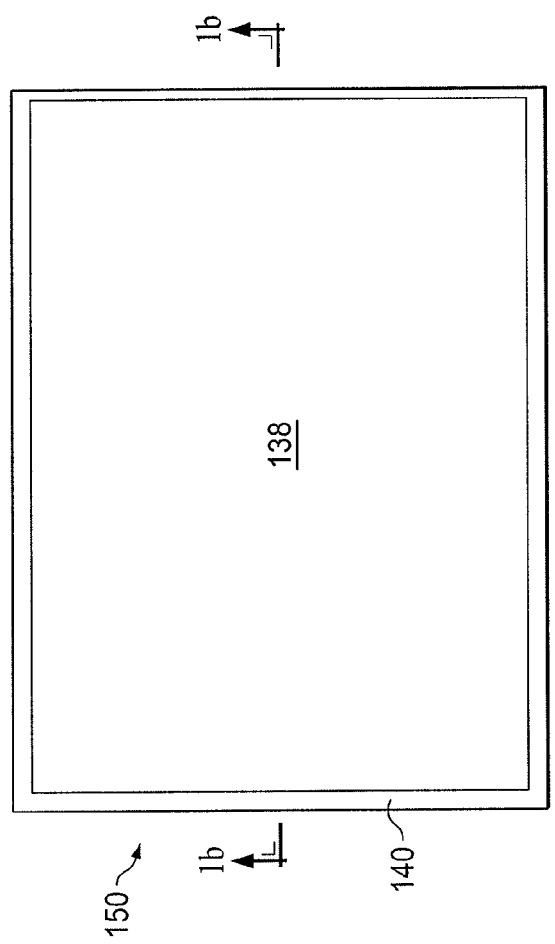
Figure 1B:
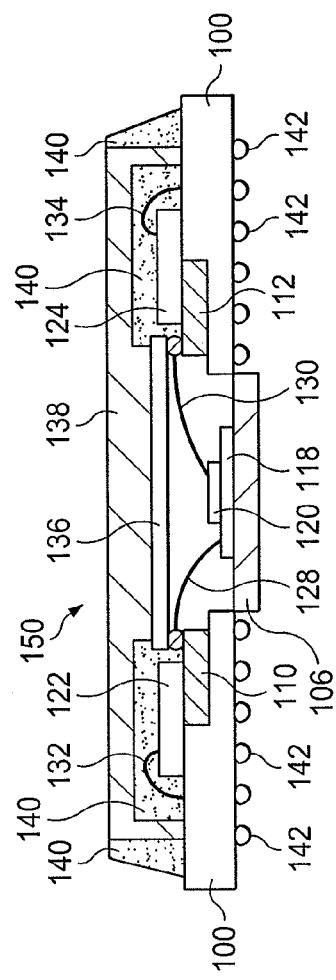

A semiconductor package is illustrated in accordance with an embodiment of the invention in FIGS. 1a-1c. FIG. 1a illustrates a top view of semiconductor package 150, FIG. 1b illustrates a cross sectional view of semiconductor package 150 along line 1b-1b, and FIG. 1c illustrates a bottom view of semiconductor package 150. Semiconductor package 150 includes substrate 100, which may be a ceramic material, for example, a printed circuit board (PCB) or a printed wiring board (PWB). For example, substrate 100 might have electrical circuitry that connects contacts on semiconductor package 150. As illustrated in FIG. 1c, a plurality of solder balls 142 is attached to the bottom surface of substrate 100. The plurality of solder balls 142, which provides electrical connection to the package, may be formed as a matrix such as a Ball Grid Array (BGA).

Die paddle 106 is disposed in a hole in substrate 100, and a plurality of leads, including first lead 110 and second lead 112, is disposed in depressions on the top surface of substrate 100. In an embodiment, the top surface of die paddle 106 is in the same plane as the bottom of substrate 100, and the bottom surface of die paddle 106 is in the same plane as the bottom of the plurality of solder balls 142 to facilitate the mounting of die paddle 106 and the plurality of solder balls 142 on the same surface. Also, in another example, the plurality of leads is embedded in substrate 100 such that the top surface of the plurality of leads is in the same plane as the top surface of substrate 100. Electrical circuitry in substrate 100 connects the plurality of solder balls 142, die paddle 106 and the plurality of leads.

First chip 118, which may be a discrete device, an integrated circuit, or a system on a chip, is disposed on the top surface of die paddle 106. For example, first chip 118 may contain a discrete device such as a MOSFET, a BJT, an SCR, or a p-n junction. In other examples, first chip 118 contains passive components such as capacitors, inductors, or resistors. In further embodiments, first chip 118 contains an integrated circuit which may contain memory, logic, or an application specific integrated circuit, or first chip 118 may contain a system on a chip. Bond wires, such as a first plurality of bond wires 128, connect first chip 118 to some of the plurality of leads, such as first lead 110. Additionally, second chip 120 is disposed on the top surface of first chip 118.

Similarly, second chip 120 is connected to some of the plurality of leads by bond wires. For example, second chip 120 is connected to second lead 112 by the second plurality of bond wires 130. In an example, second chip 120 may be a discrete device, an integrated circuit, or a system on a chip. Second chip 120 may contain a discrete device such as a MOSFET, a BJT, an SCR, or a p-n junction. In other examples, second chip 120 contains passive components such as capacitors, inductors, or resistors. In further embodiments, second chip 120 contains an integrated circuit which may contain memory, logic, or an application specific integrated circuit, or second chip 120 may contain a system on a chip.

Disposed on the top surface of substrate 100 and on some of the plurality of leads is third chip 122. In one example, third chip 122 is electrically coupled to first lead 110. Third chip 122 may be a discrete device, an integrated circuit, or a system on a chip. Third chip 122 may contain a discrete device such as a MOSFET, a BJT, an SCR, or a p-n junction. In other examples, third chip 122 contains passive components such as capacitors, inductors, or resistors. In further embodiments, third chip 122 contains an integrated circuit which may contain memory, logic, or an application specific integrated circuit, or it may contain a system on a chip.

Similarly, fourth chip 124 is disposed on the top surface of substrate 100 and on some of the plurality of leads, including second lead 112, such that fourth chip 124 is electrically coupled to second lead 112. Fourth chip 124 may be a discrete device, an integrated circuit, or a system on a chip. Fourth chip 124 may contain a discrete device such as a MOSFET, a BJT, an SCR, or a p-n junction. In other examples, fourth chip 124 contains passive components such as capacitors, inductors, or resistors. In further embodiments, fourth chip 124 contains an integrated circuit which may contain memory, logic, or an application specific integrated circuit, or fourth chip 124 may contain a system on a chip.

Disposed on the top surface of substrate 100, partially on the plurality of leads, is flip chip 136. Flip chip 136 is over, but not directly contacting, die paddle 106, first chip 118, and second chip 120. In some embodiments, flip chip 136 may be a discrete device, an integrated circuit, or a system on a chip. Flip chip 136 may contain a discrete device such as a MOSFET, a BJT, an SCR, or a p-n junction. In other examples, flip chip 136 contains passive components such as capacitors, inductors, or resistors. In further embodiments, flip chip 136 contains an integrated circuit which may contain memory, logic, or an application specific integrated circuit, or flip chip 136 may contain a system on a chip. In an embodiment, flip chip 136 is both physically and electrically connected to the plurality of leads.

Additionally, heat sink 138 is physically and thermally connected to flip chip 136 and substrate 100. Heat sink 138 may be configured to convey heat away from flip chip 136 during operation. In an example, heat sink 138 is composed of a thermally conductive material, such as copper, silver, or another thermally conductive material. An additional heat sink may be thermally coupled to heat sink 138 (not pictured).

Further, molding compound 140 may be disposed in the space or cavity surrounding first chip 118, second chip 120, third chip 122, fourth chip 124, and flip chip 136 to protect them. In an example, molding compound 140 is an electrically insulating adhesive, such as a polymer, an epoxy resin, or an epoxy resin filled with silicon oxide filler.

Figure 2A:
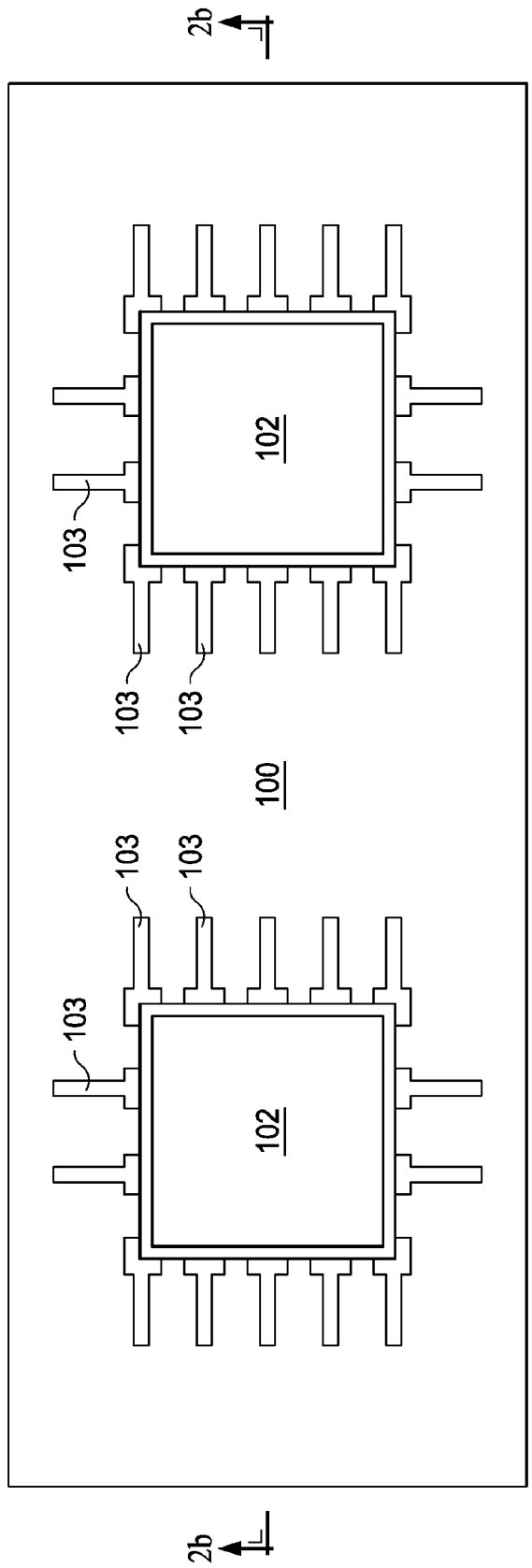
Figure 2B:
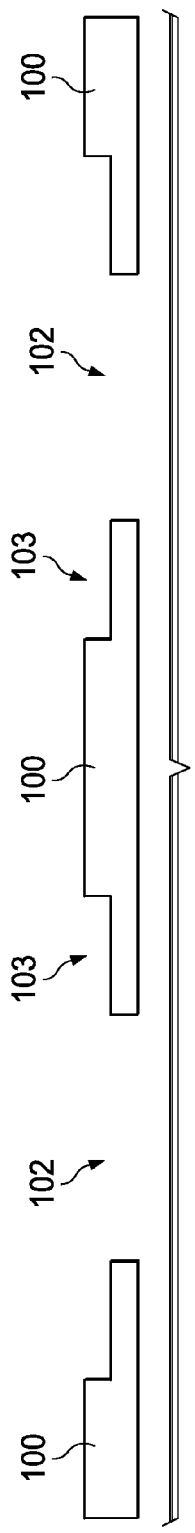
Figure 2C:
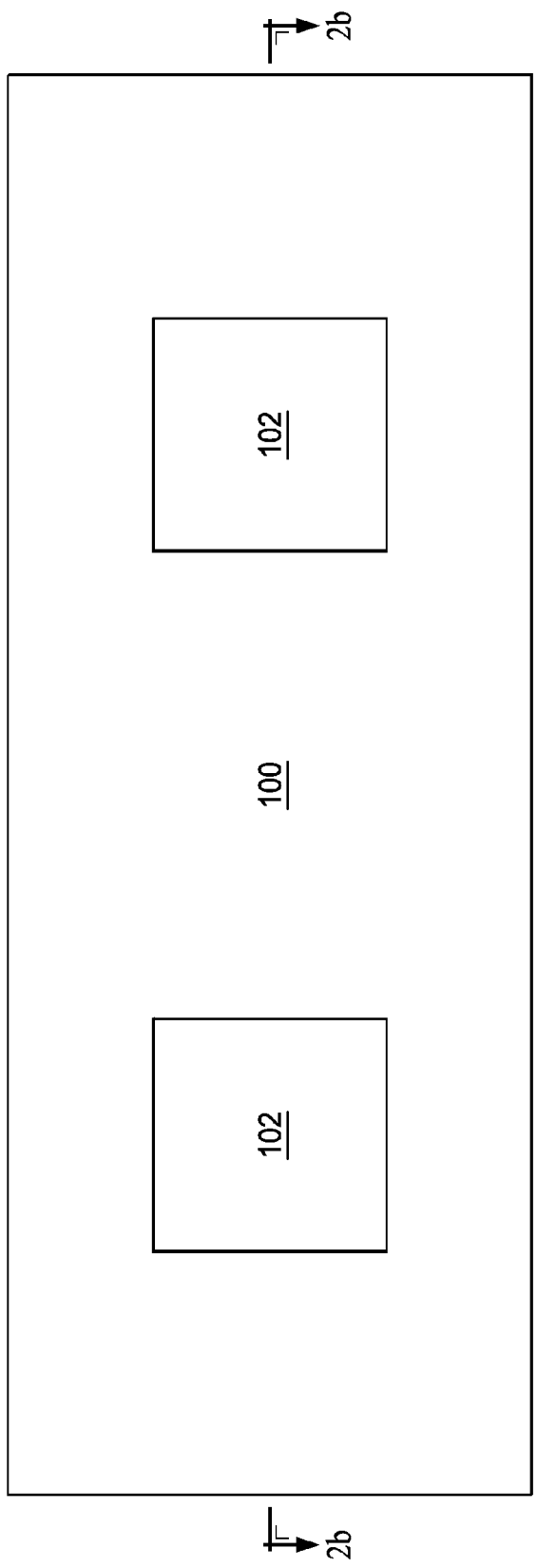
Figure 2D:
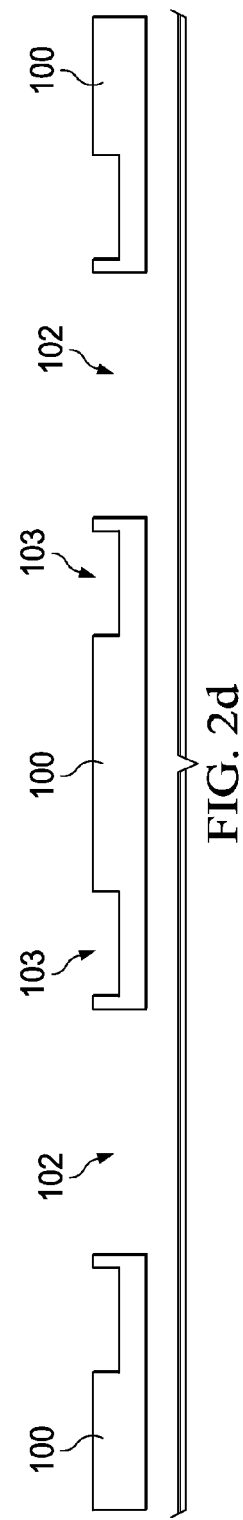

FIGS. 2-17 illustrate an embodiment of a process for forming a semiconductor package. Each of FIGS. 2-17 contain sub-figures, including sub-figure a, which illustrates a top view, sub-figure b, which illustrates a cross sectional view, and sub-figure c, which illustrates a bottom view of a given process step. Initially, FIGS. 2a, 2b, and 2c illustrate substrate 100, with hole 102 disposed through substrate 100, and a plurality of depressions 103 in the top surface of substrate 100. In an example, an adhesive material may be added into a plurality of depressions 103. In an alternative embodiment, illustrated in FIG. 2d, the plurality of depressions 103 does not extend to the edge of hole 102, while in the embodiment illustrated by FIG. 2d, the plurality of depressions 103 extend to the edge of hole 102.

Also, FIGS. 3a, 3b, and 3c illustrate lead frame 104, which contains die paddle 106 and a plurality of leads, including first lead 110, second lead 112, third lead 114, and fourth lead 116.

Lead frame 104 is a conductive support or frame structure for securely attaching an integrated circuit (IC) chip or die of a semiconductor device.

Figure 4C:
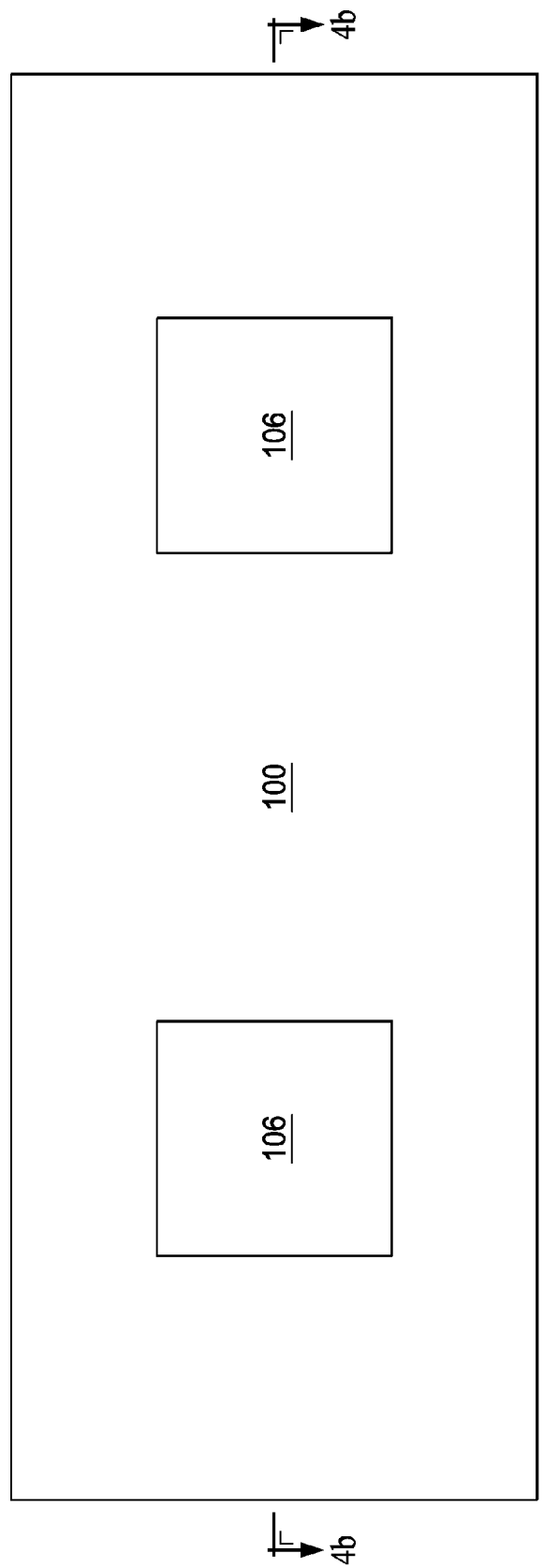

Lead frame 104 is attached to substrate 100 as described in FIG. 4. Initially, FIGS. 4a, 4b, and 4c illustrate lead frame 104 attached to substrate 100 such that the plurality of leads is placed in the plurality of depressions 103 of substrate 100 and die paddle 106 is placed in hole 102 so that the top surface of die paddle 106 is in the same plane as the bottom surface of substrate 100. Attaching lead frame 104 to substrate 100 may be performed by picking and placing lead frame 104, possibly after applying an adhesive to substrate 100. A bar holds the die paddle.

Figure 5A:
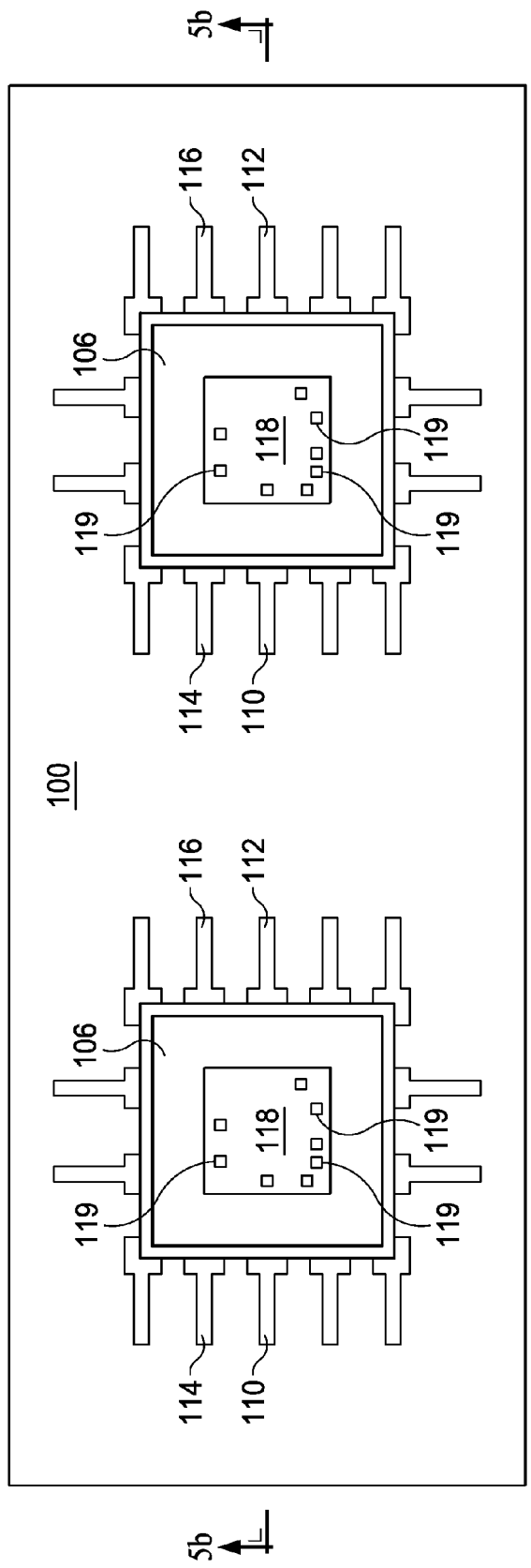
Figure 5B:
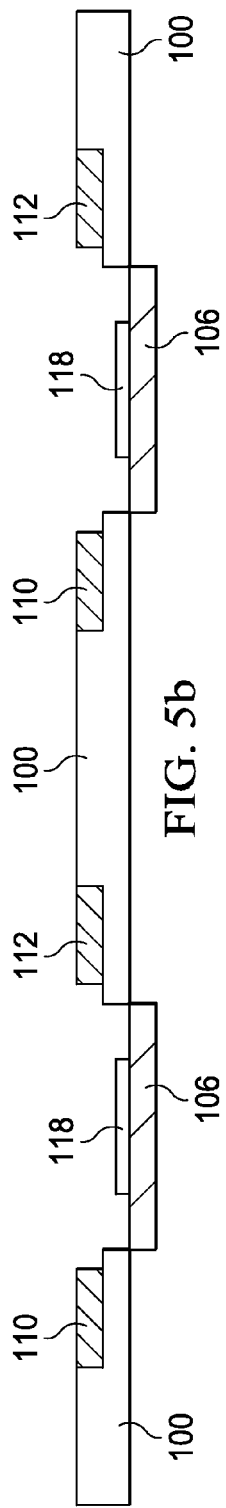
Figure 5C:
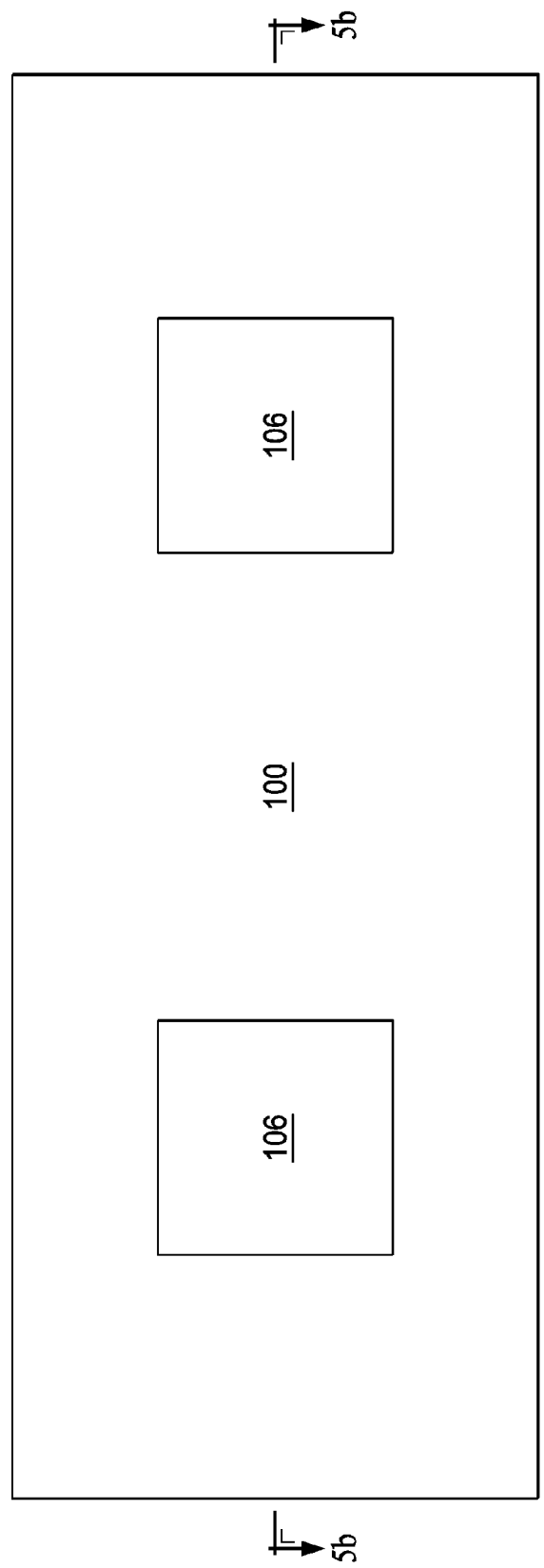
Figure 6A:
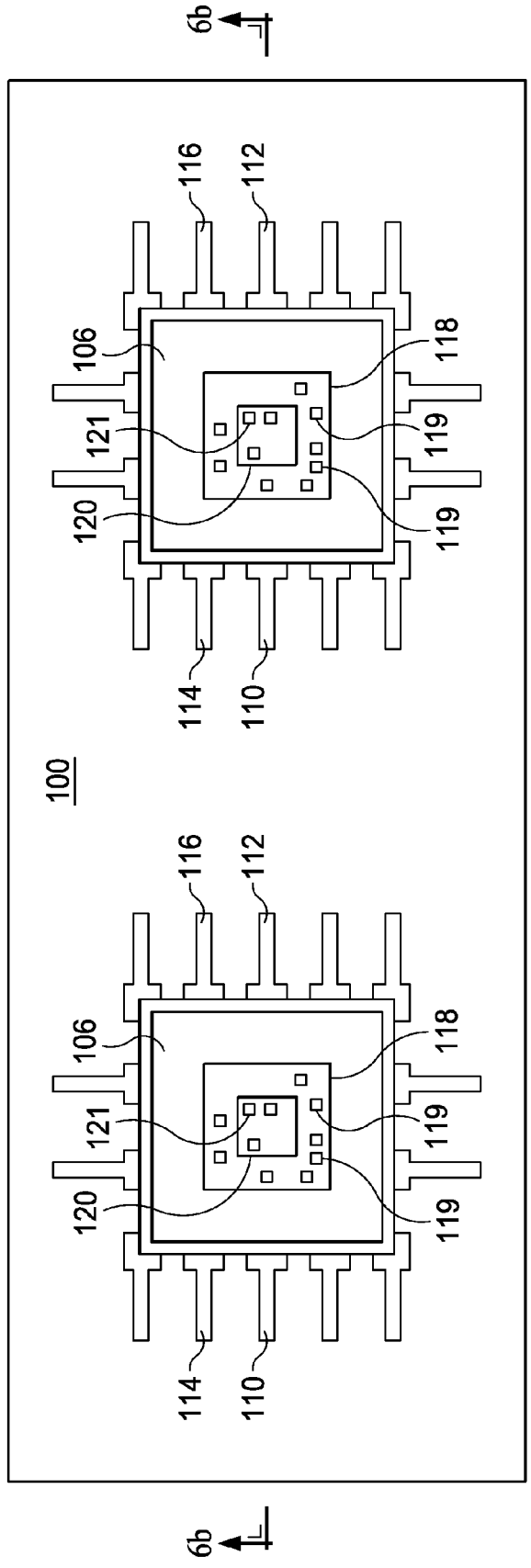
Figure 6B:
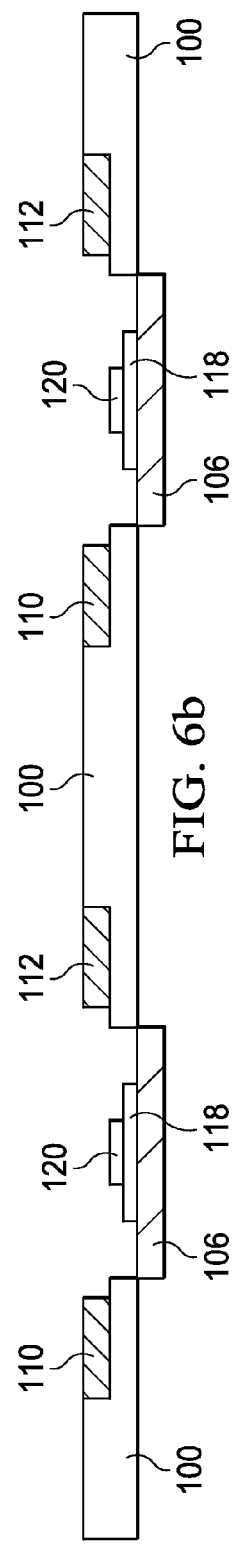
Figure 6C:
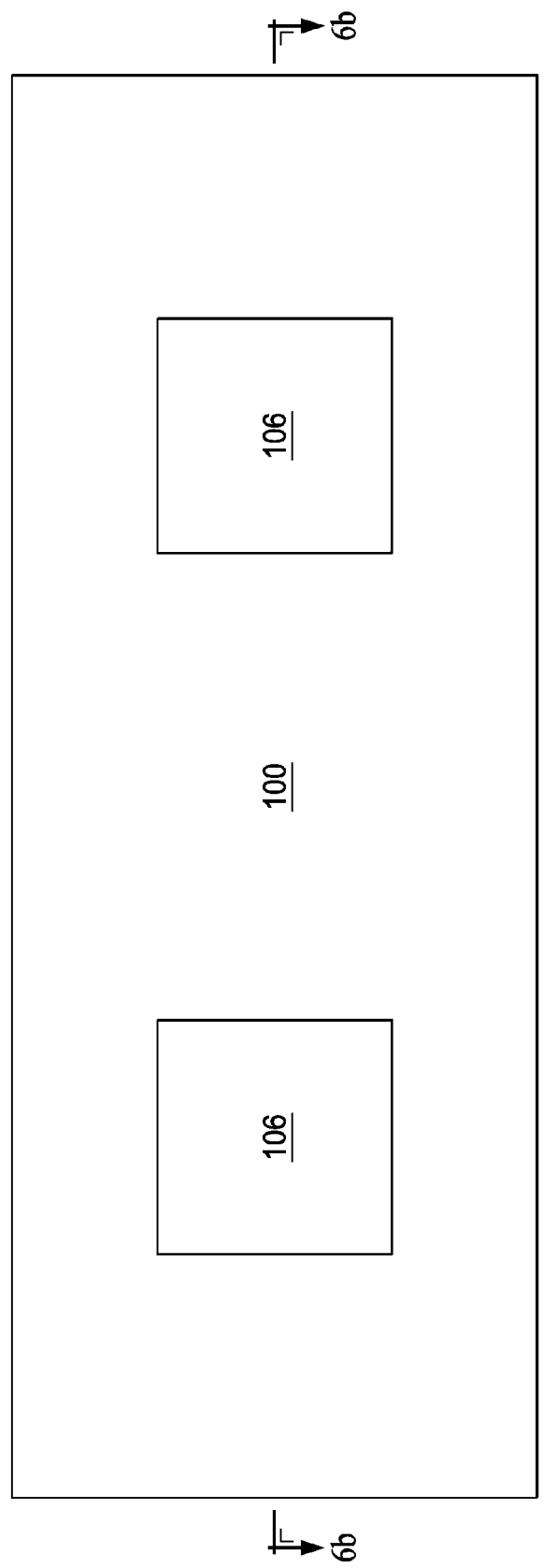

Next, first chip 118 and second chip 120 are attached to the integrated lead frame-substrate. FIGS. 5a, 5b, and 5c illustrate first chip 118, the top surface of which contains a first plurality of contact pads 119, attached to the top surface of die paddle 106. The attachment of first chip 118 to die paddle 106 may be performed using glue, such as epoxy glue, diffusion solder, or die attach film. Then, FIGS. 6a, 6b, and 6c illustrate second chip 120 attached to the top surface of first chip 118, which may be performed using glue, such as epoxy glue, diffusion solder, or die attach film. In an embodiment, the top surface of second chip 120 contains a second plurality of contact pads 121.

Figure 7C:
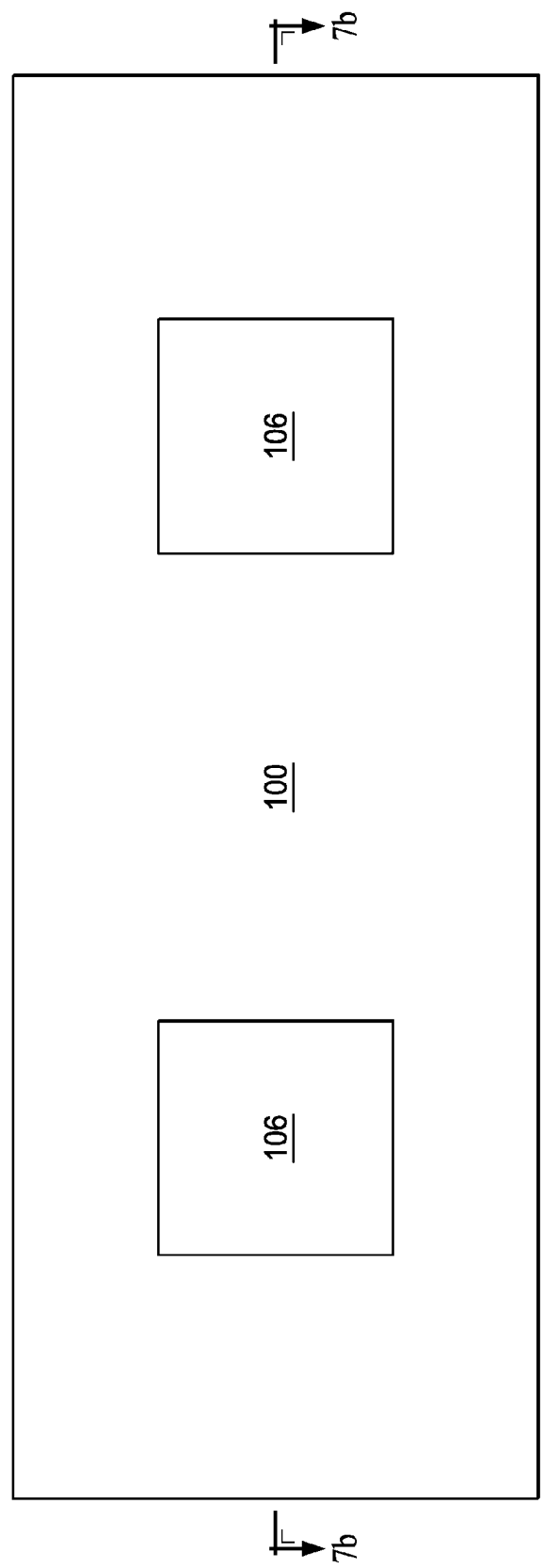

After that, as illustrated in FIGS. 7a, 7b, and 7c, third chip 122 is attached to the top surface of substrate 100. Some of the plurality of leads, including first lead 110 and third lead 114, may be used to electrically connect third chip 122 to these leads. Attaching third chip 122 to the top surface of substrate 100 and the plurality of leads may be performed using glue, such as epoxy glue, diffusion solder, or die attach film. In an embodiment, third chip 122 has a third plurality of contact pads 123 disposed on its top surface.

Figure 8C:
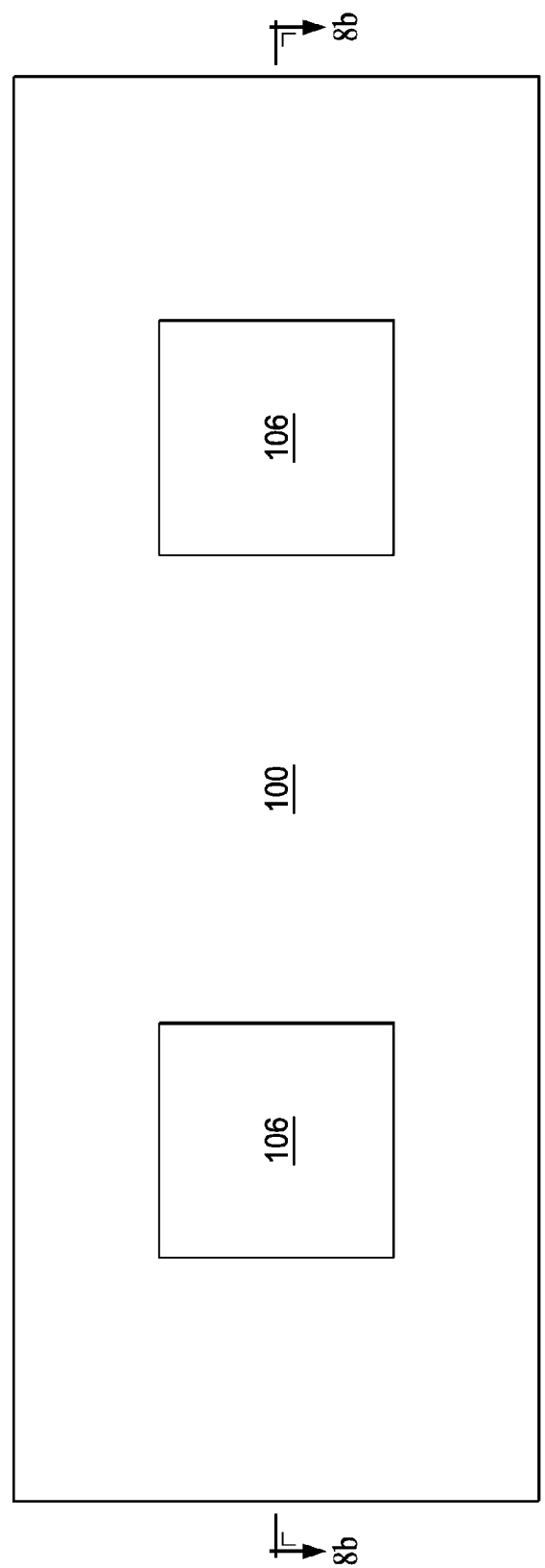

Similarly, FIGS. 8a, 8b, and 8c illustrate fourth chip 124 attached to the top surface of substrate 100 and some the plurality of leads, including second lead 112 and fourth lead 116, such that fourth chip 124 is electrically coupled to these leads. The attachment may be performed using glue, such as epoxy glue, diffusion solder, or die attach film. Also, fourth chip 124 has a fourth plurality of contact pads 125 disposed on its top surface.

Figure 9C:
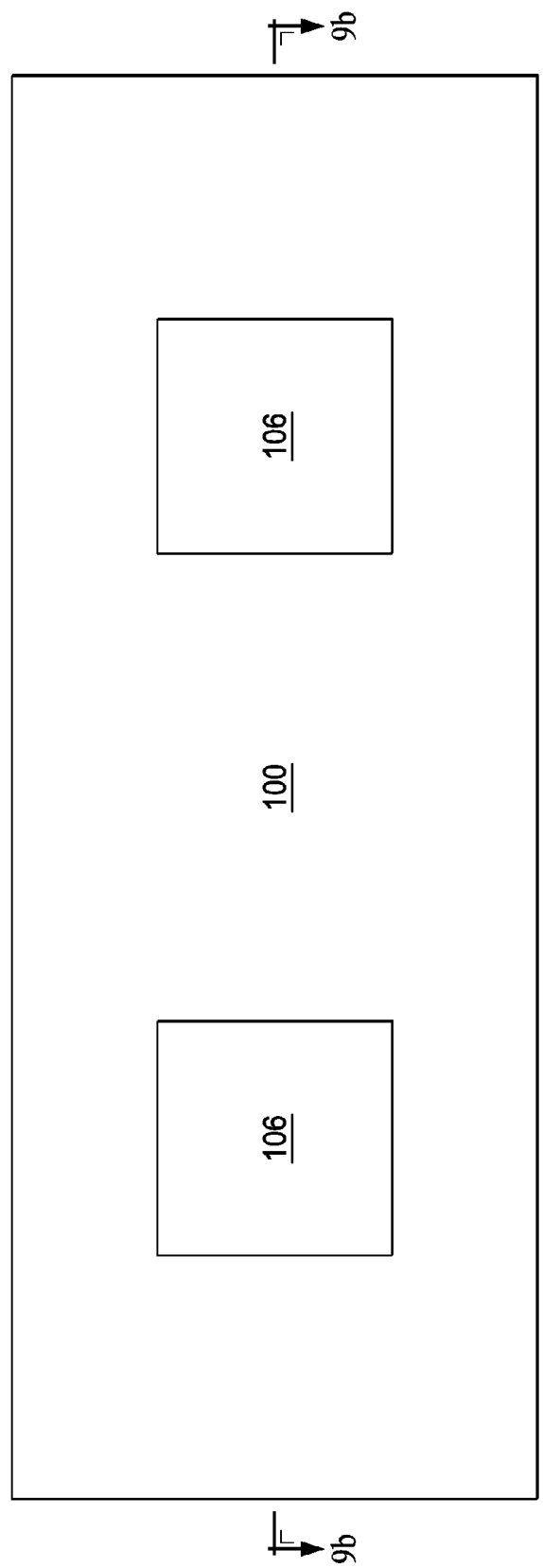

FIGS. 9a, 9b, and 9c illustrate a first plurality of bond wires 128 attached to the first plurality of contact pads 119 on first chip 118, to die paddle 106, and to some of the plurality of leads, including first lead 110. Attaching the first plurality of bond wires 128 may be performed by using ball stitch on ball (BSOB) bonding. In performing BSOB, initially a ball bond is formed on one of first plurality of contact pads 119. Next, a stitch bond is formed on the opposite end of a first of the first plurality of bond wires 128, attaching the first of the first plurality of bond wires 128 to, for example, first lead 110 and die paddle 106.

Figure 10C:
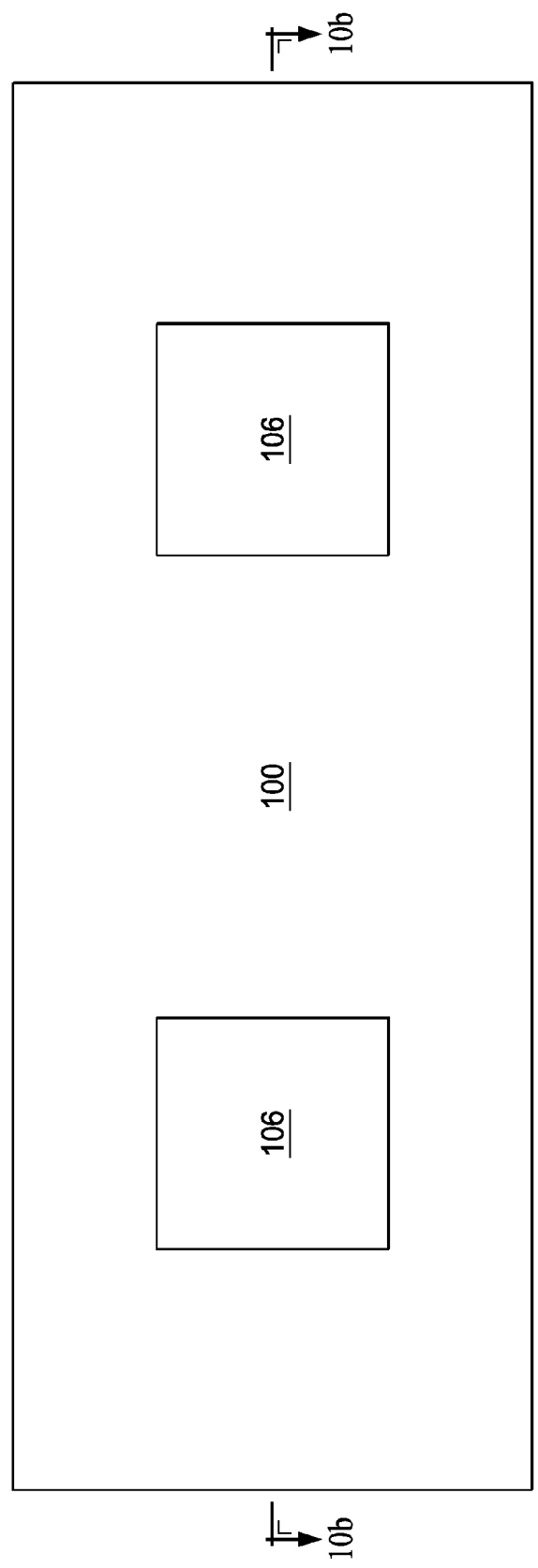

Similarly, FIGS. 10a, 10b, and 10c illustrate a second plurality of bond wires 130 attached to the second plurality of contact pads 121 on second chip 120 to some of the plurality of leads, including third lead 114, fourth lead 116, and second lead 112. The attachment may be performed using BSOB bonding.

Figure 11C:
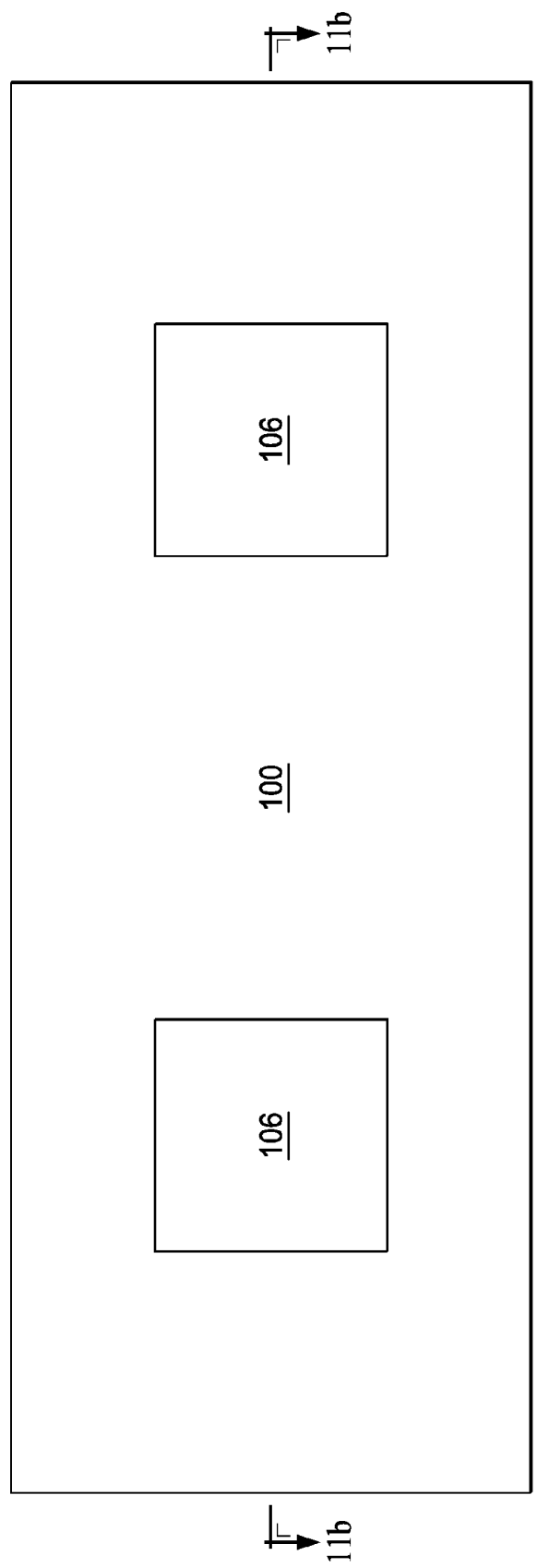

After that, FIGS. 11a, 11b, and 11c illustrate a third plurality of bond wires 132 connecting the third plurality of contact pads 123 on third chip 122 to some of the plurality of leads and to substrate 100. The attachment of the third plurality of bond wires 132 may also be performed using BSOB bonding.

Figure 12C:
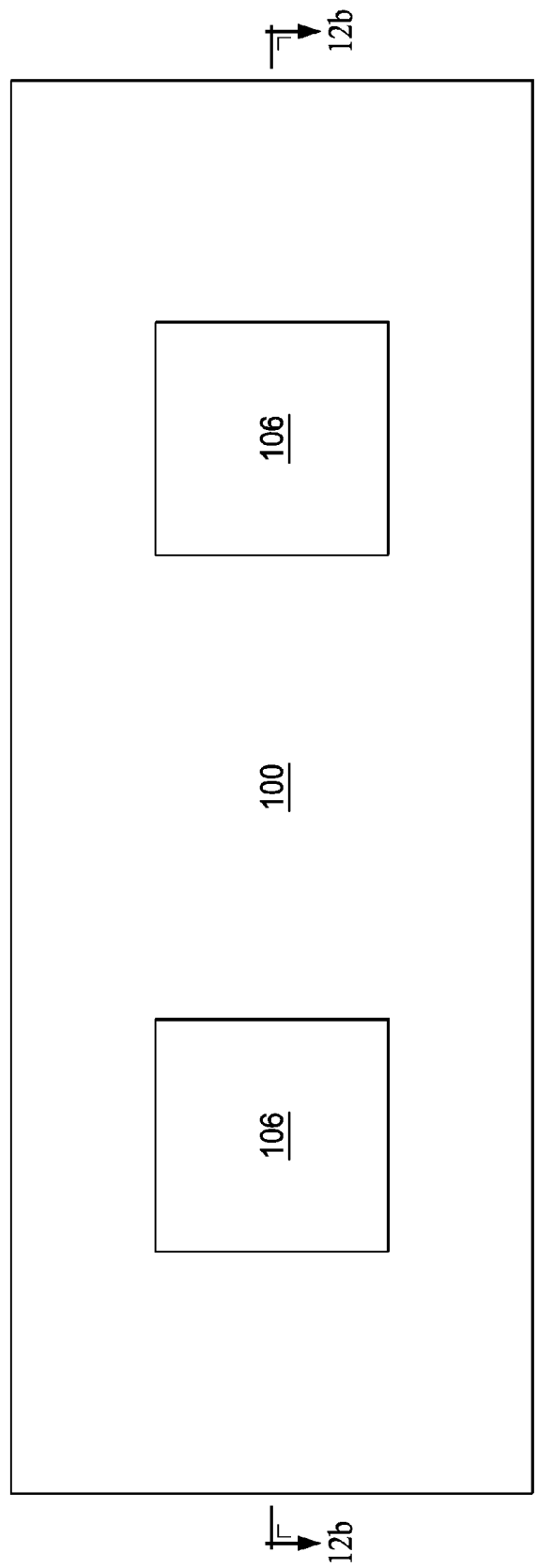

Similarly, FIGS. 12a, 12b, and 12c illustrate a fourth plurality of bond wires 134 attached to the fourth plurality of contact pads 125 on fourth chip 124, to some of the plurality of leads, and to substrate 100. The attachment maybe performed using BSOB.

Figure 13C:
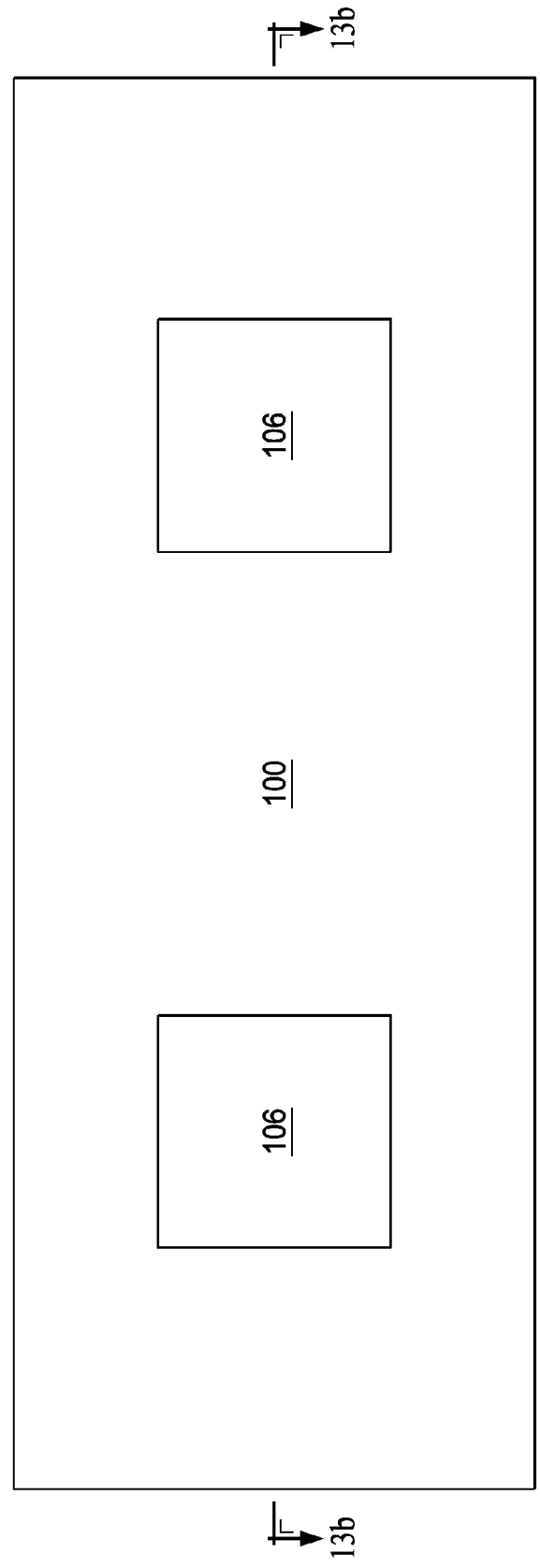

Next, FIGS. 13a, 13b, and 13c illustrate flip chip 136 attached to substrate 100 and the plurality of leads. Flip chip 136 may be physically and electrically contacted with the plurality of leads, including first lead 110, second lead 112, third lead 114, and fourth lead 116. Flip chip 136 is attached to the stitch bonds of one of the first plurality of bond wires 128 and one of the second plurality of bond wires 130. In an embodiment, attaching flip chip 136 may be performed by a handling arm of a flip chip bonder picking and flipping flip chip 136 on the stitch bond on the leads.

Figure 14A:
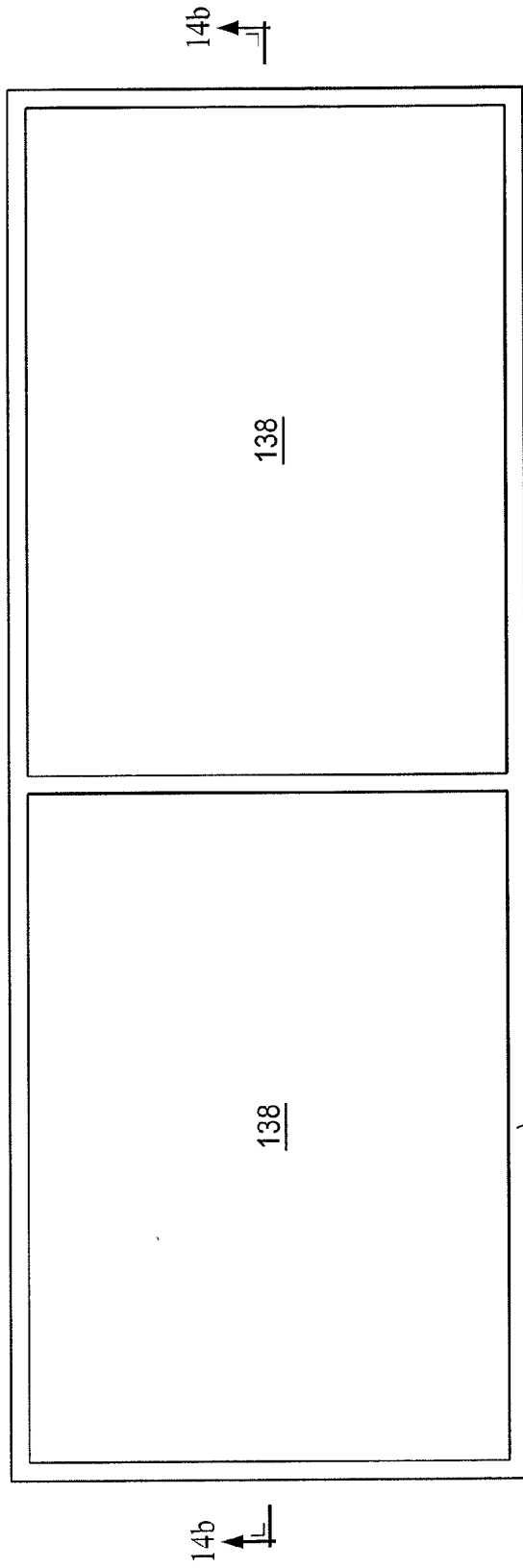
Figure 14B:
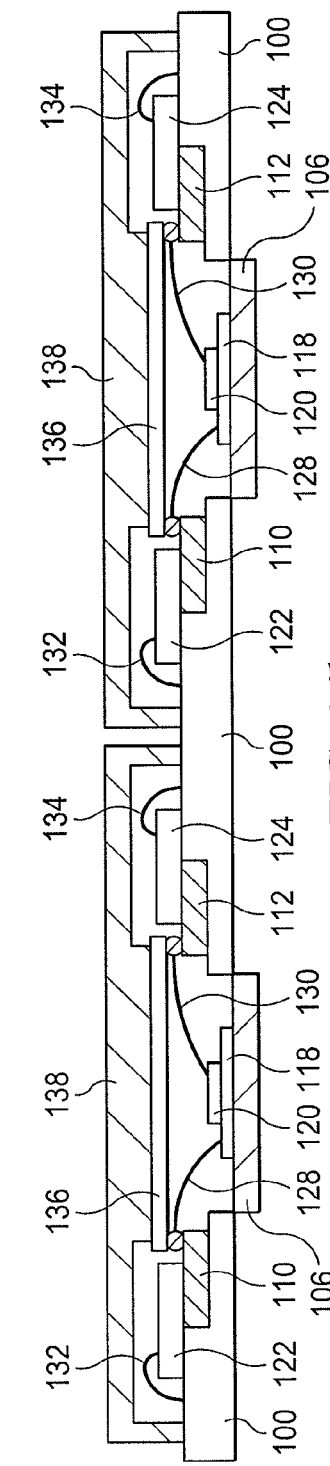
Figure 14C:
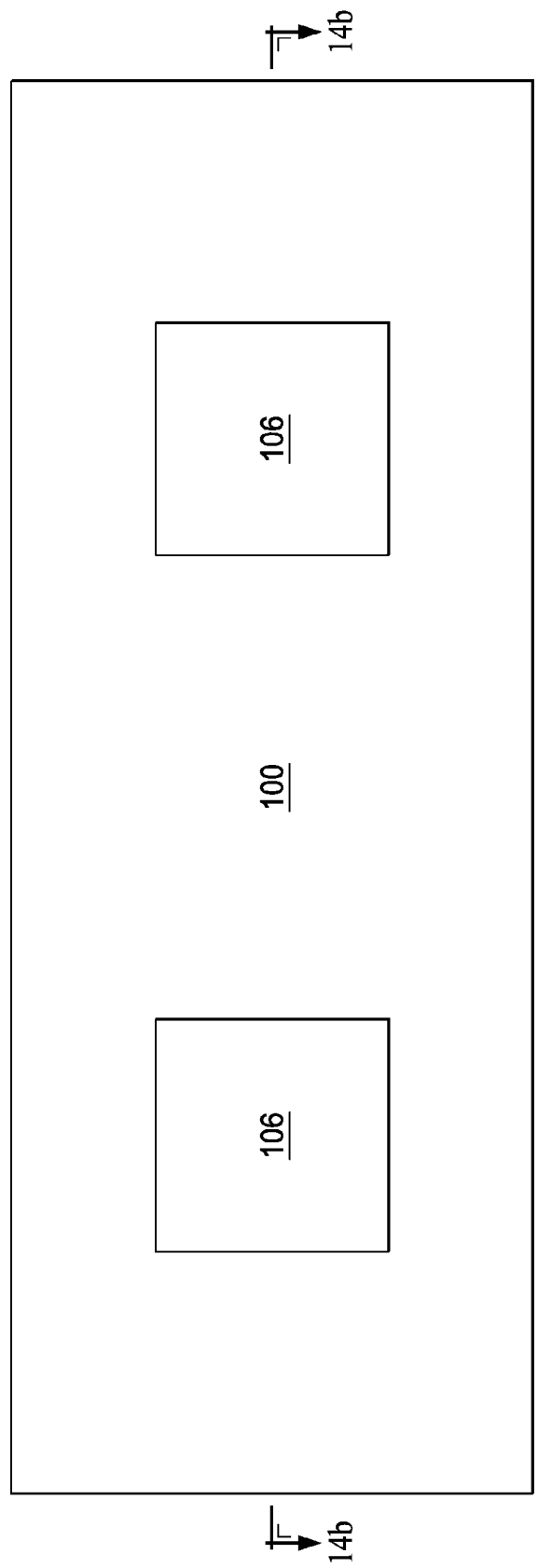

Also, FIGS. 14a, 14b, and 14c illustrate heat sink 138 attached to substrate 100 and flip chip 136. In an example, attaching heat sink 138 may be performed using diffusion solder or a die attach film. Alternately, heat sink 138 may be attached to flip chip 136 before attaching the flip chip 136 to substrate 100 and the leads. After that, heat sink 138 and flip chip 136 are attached to substrate 100 and the plurality of leads. Heat sink 138 may have different types of design in various embodiments to facilitate efficient removal of heat from the attached flip chip 136.

Figure 15A:
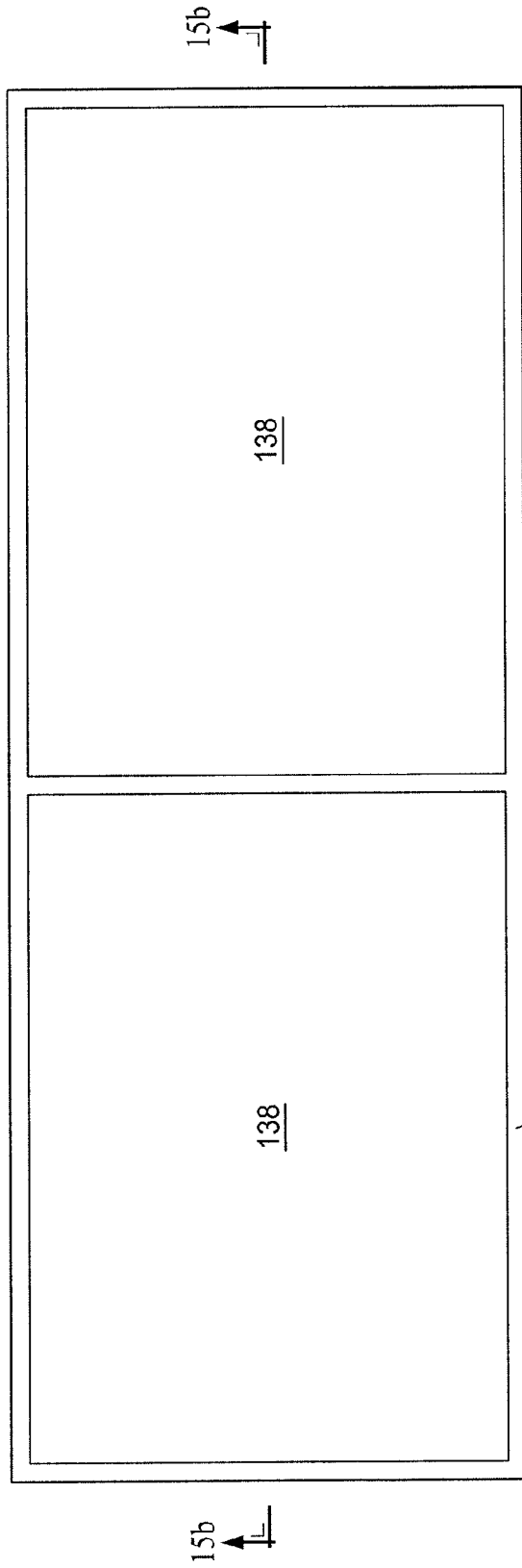
Figure 15B:
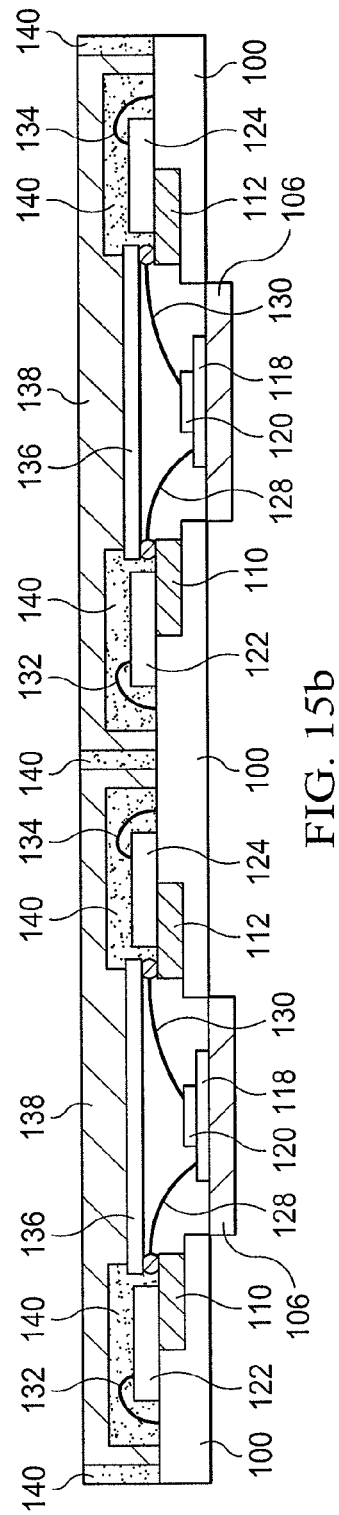
Figure 15C:
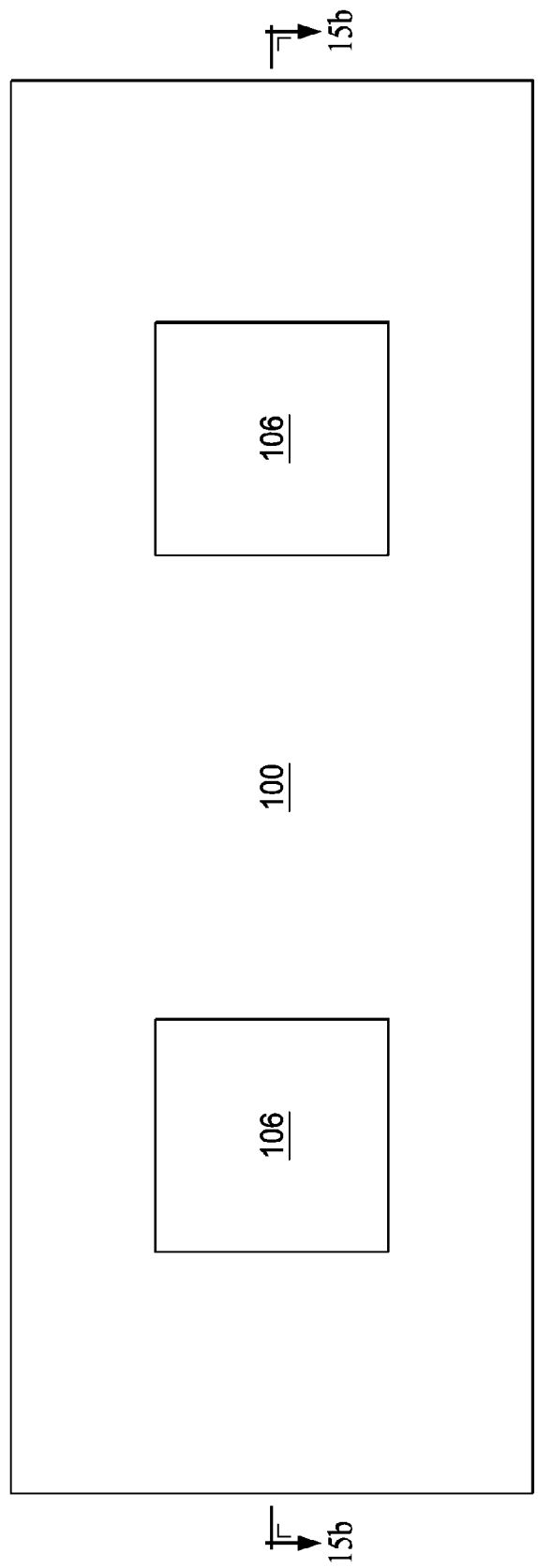

FIGS. 15a, 15b, and 15c illustrate molding compound 140 disposed in the gaps between flip chip 136 and die paddle 106 and between heat sink 138 and substrate 100. In one example, molding compound 140 is introduced when liquid epoxy is injected to fill the gap, followed by a curing process, which may be performed at a temperature between about 200° C. to about 400° C. In another example, a molding compound material is melted and flowed into a molding case at a temperature from about 160° C. to about 185° C. After that, the molding compound material may be cured to form molding compound 140.

Figure 16C:
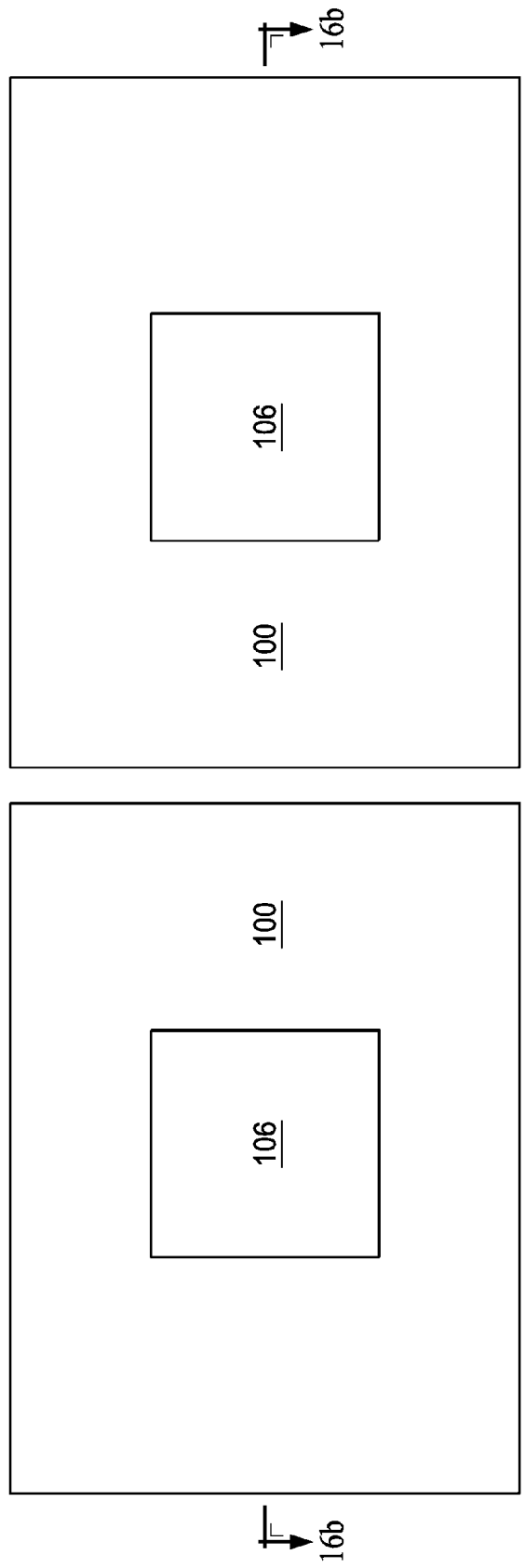
Figure 17A:
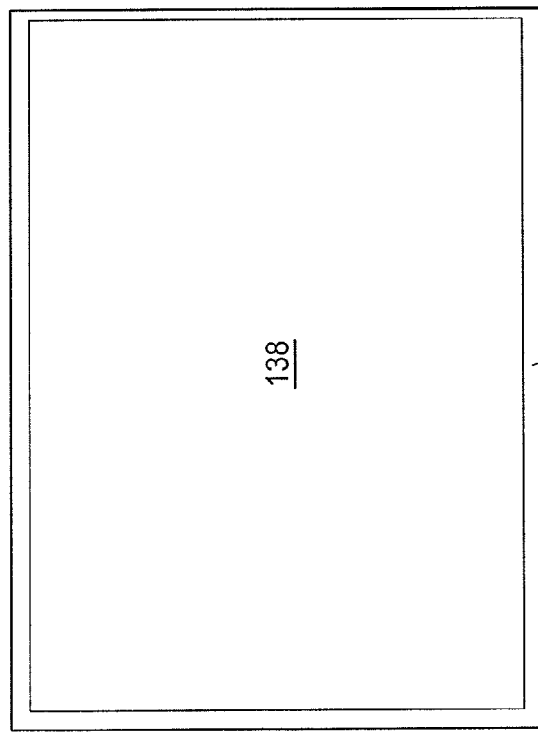
Figure 17B:
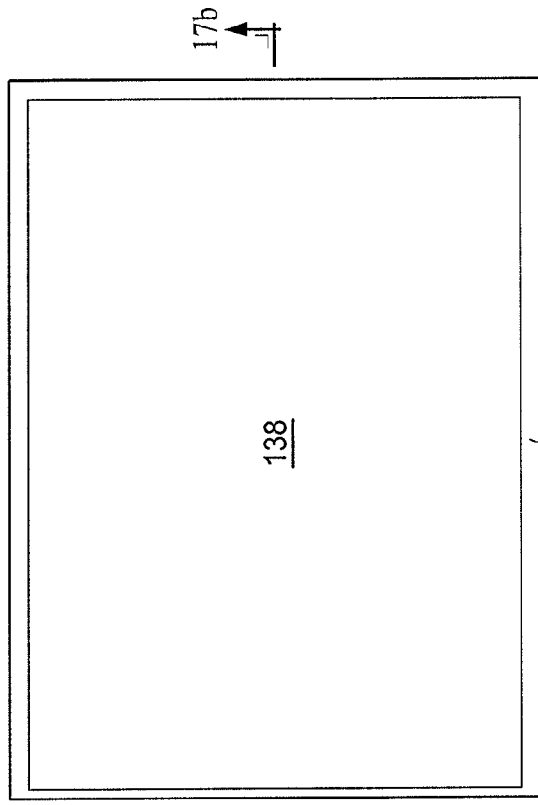
Figure 17C:
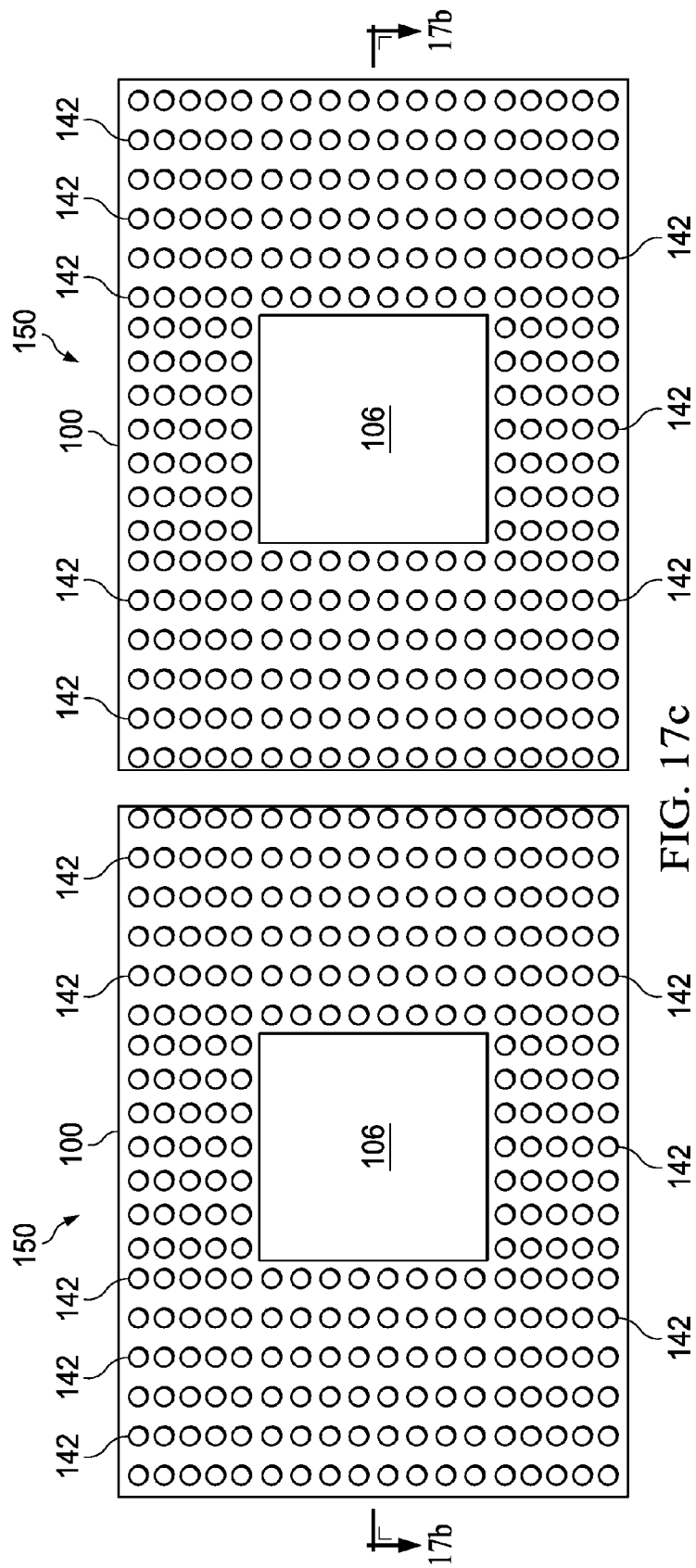

As shown in FIGS. 16a, 16b, and 16c, the semiconductor packages are separated or singulated. In an embodiment, the packages are singulated by sawing. Alternatively, a chemical process may be used to singulate the packages into separate units. Finally, as illustrated by FIGS. 17a, 17b, and 17c, a plurality of solder balls 142 are attached to the bottom surface of substrate 100.

Figure 18A:
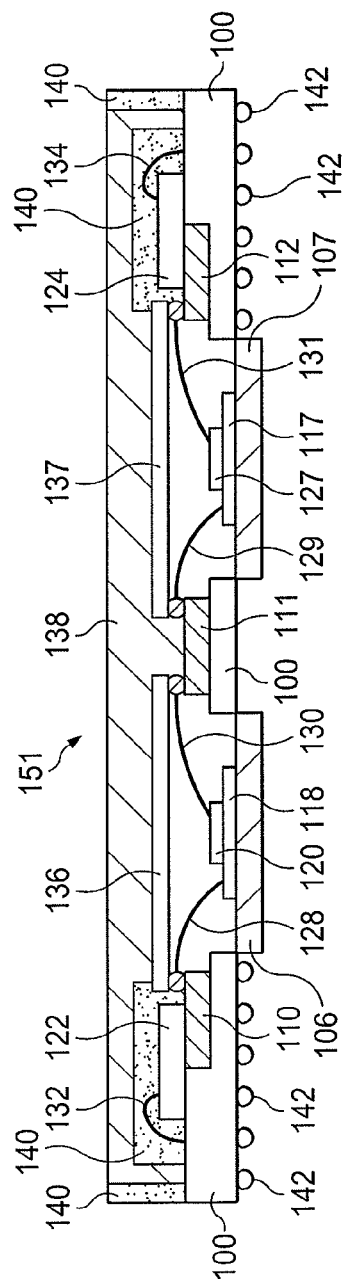
FIGS. 18a and 18b illustrate semiconductor packages in accordance with other embodiments of the invention.
Figure 18B:
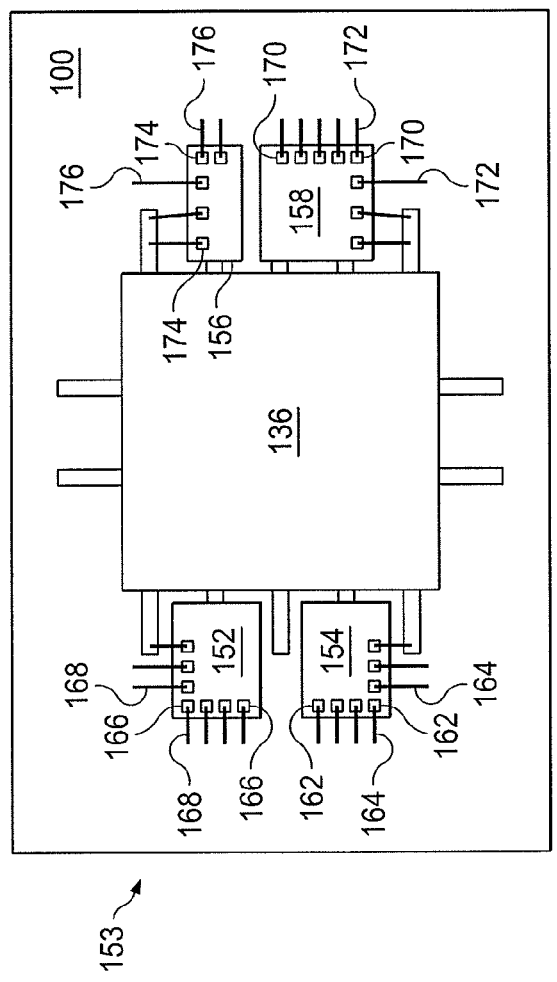

Alternate embodiment semiconductor packages containing additional chips are illustrated by FIGS. 18a and 18b. The embodiment illustrated in FIG. 18a includes flip chip 137 in addition to flip chip 136. Semiconductor package 151 illustrated in FIG. 18a is similar to semiconductor package 150 illustrated in FIG. 1b, with the following differences. Instead of coupling second chip 120 to second lead 112 as in semiconductor package 150 of FIG. 1b, in semiconductor package 151 illustrated in FIG. 18a, the second plurality of bond wires 130 couples second chip 120 to third lead 111. Also, fifth chip 117 is disposed on the top surface of second die paddle 107, while sixth chip 127 is disposed on the top surface of fifth chip 117. A fifth plurality of bond wires 131 connects fifth chip 117 to some of the plurality of leads, including to second lead 112, while a sixth plurality of bond wires 129 connects sixth chip 127 to some of the plurality of leads, including to third lead 111. Additionally, second flip chip 137 is disposed on the top surface of substrate 100, partially on some of the plurality of leads, including second lead 112 and third lead 111. Like flip chip 136, second flip chip 137 is over, but not directly contacting, second die paddle 107, fifth chip 117, and sixth chip 127.

Fifth chip 117, sixth chip 127, and second flip chip 137 may be discrete devices, integrated circuits, or systems on a chip. For example, fifth chip 117, sixth chip 127, and second flip chip 137 may contain discrete devices such as MOSFETs, BJTs, SCRs, or p-n junctions. In other examples, fifth chip 117, sixth chip 127, and second flip chip 137 contain passive components such as capacitors, inductors, or resistors. In further embodiments, fifth chip 117, sixth chip 127, and second flip chip 137 contain integrated circuits which may contain memory, logic, or an application specific integrated circuit, or they may contain systems on a chip. Heat sink 138 is physically and thermally connected to second flip chip 137. Additionally, molding compound 140 is disposed in the space or cavity surrounding fifth chip 117, sixth chip 127, and second flip chip 137.

FIG. 18b illustrates another embodiment semiconductor package containing additional chips. Semiconductor package 153 illustrated in FIG. 18b is similar to semiconductor package 150 illustrated in FIG. 1b with the following differences. Heat sink 138 and molding compound 140 are not pictured in FIG. 18b for clarity, but are present in semiconductor package 153. Instead of third chip 122 in semiconductor package 150, seventh chip 152 and eighth chip 154 are disposed on substrate 100 and on the plurality of leads in semiconductor package 153. A fifth plurality of contacts 166 is disposed on the top surface of seventh chip 152, and a seventh plurality of bond wires 168 connect seventh chip 152 to some of the plurality of leads. Similarly, a sixth plurality of contacts 162 are disposed on the top surface of eight chip 154, and an eight plurality of bond wires 164 connect eighth chip 154 to some of the plurality of leads. Seventh chip 152 and eighth chip 154 may be discrete devices, integrated circuits, or systems on a chip. For example, seventh chip 152 and eighth chip 154 may contain discrete devices such as MOSFETs, BJTs, SCRs, or p-n junctions. In other examples, seventh chip 152 and eighth chip 154 contain passive components such as capacitors, inductors, or resistors. In further embodiments, seventh chip 152 and eighth chip 154 contain integrated circuits which may contain memory, logic, or an application specific integrated circuit, or they may contain systems on a chip.

Additionally, instead of fourth chip 124 in semiconductor package 150, semiconductor package 153 has ninth chip 156 and tenth chip 158 disposed on the top surface of substrate 100 and on some of the plurality of leads. Ninth chip 156 has a seventh plurality of contacts 174 disposed on its top surface, while tenth chip 158 has an eighth plurality of contacts 170 disposed on its top surface. A ninth plurality of bond wires 176 connect the seventh plurality of contacts 174 of ninth chip 156 to some of the plurality of leads, while a tenth plurality of bond wires 172 connect the eighth plurality of contacts 170 of tenth chip 158 to some of the plurality of leads. Ninth chip 156 and tenth chip 158 may be discrete devices, integrated circuits, or systems on a chip. For example, ninth chip 156 and tenth chip 158 may contain discrete devices such as MOSFETs, BJTs, SCRs, or p-n junctions. In other examples, ninth chip 156 and tenth chip 158 contain passive components such as capacitors, inductors, or resistors. In further embodiments, ninth chip 156 and tenth chip 158 contain integrated circuits which may contain memory, logic, or an application specific integrated circuit, or they may contain systems on a chip.

Advantages of the present invention include good electrical performance and thermal cooling performance. Additionally, embodiments enable good device functionality in a single package.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a ball grid array ceramic substrate having a first surface and a second surface opposite the first surface, the ball grid array ceramic substrate comprising electrical circuitry to couple contacts on the first surface to contacts on the second surface, wherein the ball grid array ceramic substrate has a first hole;

a plurality of leads is disposed over the first surface of the ball grid array ceramic substrate, one or more leads of the plurality of leads coupled to the contacts on the first surface;

a die paddle is disposed in the first hole;

an encapsulant disposed over the ball grid array ceramic substrate, die paddle and the plurality of leads;

a first chip disposed over the die paddle, wherein the first chip is electrically coupled to a first lead of the plurality of leads; and a second chip disposed over the first chip, wherein the second chip is electrically coupled to a second lead of the plurality of leads.

2. The semiconductor device of claim 1, further comprising a plurality of solder balls disposed at the second surface of the ball grid array ceramic substrate and coupled to the contacts on the second surface of the ball grid array ceramic substrate.

3. The semiconductor device of claim 1, further comprising a third chip disposed over the first surface of the ball grid array ceramic substrate, wherein the third chip is electrically coupled to a third lead of the plurality of leads.

4. The semiconductor device of claim 3, further comprising:
a fourth chip disposed over the first surface of the ball grid array ceramic substrate, wherein the fourth chip is electrically coupled to a fourth lead of the plurality of leads; and
a fifth chip disposed over the first surface of the ball grid array ceramic substrate and over the plurality of leads, wherein the fifth chip is electrically coupled to a fifth lead of the plurality of leads.

5. A semiconductor device comprising:
a ball grid array ceramic substrate having a first surface and a second surface opposite the first surface, the ball grid array ceramic substrate comprising electrical circuitry to couple contacts on the first surface to contacts on the second surface, wherein the ball grid array ceramic substrate has a first hole;
a plurality of leads is disposed over the first surface of the ball grid array ceramic substrate, one or more leads of the plurality of leads coupled to the contacts on the first surface;
a die paddle is disposed in the first hole;
an encapsulant disposed over the ball grid array ceramic substrate, die paddle and the plurality of leads;
a second chip disposed over the first surface of the ball grid array ceramic substrate and over the plurality of leads, wherein the second chip is electrically coupled to a second lead of the plurality of leads, wherein the second chip has a major surface comprising a contact pad; and
a chip support for holding the second chip, the chip support disposed over the second chip, wherein the chip support is coupled to the first surface of the ball grid array ceramic substrate.

6. The semiconductor device of claim 5, wherein the chip support comprises a conductor.

7. The semiconductor device of claim 5, wherein the contact pad is coupled to the second lead of the plurality of leads and wherein the first chip has a major surface, wherein the major surface of the first chip faces the major surface of the second chip.

8. A semiconductor device comprising:
a ball grid array ceramic substrate having a first surface and a second surface opposite the first surface, the ball grid array ceramic substrate comprising electrical circuitry to couple contacts on the first surface to contacts on the second surface, wherein the ball grid array ceramic substrate has a first hole;
a plurality of leads is disposed over the first surface of the ball grid array ceramic substrate, one or more leads of the plurality of leads coupled to the contacts on the first surface;
a die paddle is disposed in the first hole;
an encapsulant disposed over the ball grid array ceramic substrate, die paddle and the plurality of leads;
a second chip disposed over the first surface of the ball grid array ceramic substrate and over the plurality of leads, wherein the second chip is electrically coupled to a second lead of the plurality of leads;
a chip support for holding the second chip, the chip support disposed over the second chip, wherein the chip support is coupled to the first surface of the ball grid array ceramic substrate; and
a third chip disposed on the first surface of the ball grid array ceramic substrate, wherein the third chip is electrically coupled to a third lead of the plurality of leads.

9. A semiconductor device comprising:
a first chip support comprising a ball grid array ceramic substrate and having a first surface and a second surface opposite the first surface, the ball grid array ceramic substrate comprising electrical circuitry to couple contacts on the first surface to contacts on the second surface, wherein the first chip support has a first hole;
a second chip support attached to the first chip support and disposed in the first hole of the first chip support, wherein the second chip support comprises a die paddle of a lead frame;
a plurality of leads disposed on the first surface of the first chip support, one or more leads of the plurality of leads coupled to the contacts on the first surface; and
a third chip support attached to the first surface of the first chip support.

10. The semiconductor device of claim 9, further comprising a first chip disposed over the first surface of the first chip support and over the plurality of leads.

11. The semiconductor device of claim 9, wherein the third chip support comprises a conductive heat sink.

12. The semiconductor device of claim 9, further comprising an encapsulant disposed over the second chip support and the plurality of leads.

13. The semiconductor device of claim 12, further comprising a plurality of solder balls disposed at the second surface of the first chip support and coupled to the contacts on the second surface of the ball grid array ceramic substrate.

14. The semiconductor device of claim 9, further comprising:
a first chip disposed over the second chip support; and
a second chip disposed over the first surface of the first chip support.

15. The semiconductor device of claim 14, further comprising:
a third chip disposed over the first chip; and
a fourth chip disposed over the first surface of the first chip support.

* * * * *